(12) United States Patent
Apanowicz et al.

(10) Patent No.: US 8,700,579 B2
(45) Date of Patent: Apr. 15, 2014

(54) METHOD AND SYSTEM FOR DATA COMPRESSION IN A RELATIONAL DATABASE

(75) Inventors: Cas Kazimierz Apanowicz, Toronto (CA); Victoria K. Eastwood, Toronto (CA); Dominik A. Slezak, Warszawa (PL); Piotr D. Synak, Warszawa (PL); Arkadiusz G. Wojna, Warszawa (PL); Marcin Wojnarski, Warszawa (PL); Jakub Z. Wroblewski, Lomianki (PL)

(73) Assignee: Infobright Inc., Toronto, Ontario (CA)

( * ) Notice: Subject to any disclaimer, the term of this patent is extended or adjusted under 35 U.S.C. 154(b) by 599 days.

(21) Appl. No.: 11/843,019

(22) Filed: Aug. 22, 2007

(65) Prior Publication Data

US 2008/0071818 A1    Mar. 20, 2008

Related U.S. Application Data

(60) Provisional application No. 60/845,167, filed on Sep. 18, 2006.

(51) Int. Cl.
*G06F 7/00* (2006.01)
*G06F 17/00* (2006.01)

(52) U.S. Cl.
USPC .......................................................... 707/693

(58) Field of Classification Search
USPC .......................................................... 707/693
See application file for complete search history.

(56) References Cited

U.S. PATENT DOCUMENTS

| | | | |
|---|---|---|---|
| 5,463,772 A * | 10/1995 | Thompson et al. ........... | 707/693 |
| 5,551,027 A | 8/1996 | Choy et al. | |
| 5,696,960 A | 12/1997 | Bhargava et al. | |
| 5,794,228 A * | 8/1998 | French et al. ........... | 1/1 |
| 5,794,229 A * | 8/1998 | French et al. ........... | 1/1 |
| 5,794,246 A | 8/1998 | Sankaran et al. | |
| 5,838,964 A * | 11/1998 | Gubser ........... | 1/1 |
| 5,873,091 A | 2/1999 | Garth et al. | |
| 5,918,225 A | 6/1999 | White et al. | |

(Continued)

FOREIGN PATENT DOCUMENTS

| | | |
|---|---|---|
| WO | 99/48018 | 9/1999 |
| WO | 03/105489 | 12/2003 |
| WO | 2008/016877 | 2/2008 |

OTHER PUBLICATIONS

D.J. Abadi. Column Stores for Wide and Sparse Data. In Proceedings of the Conference on Innovative Database Research (CIDR), 2007, 292-297.

(Continued)

*Primary Examiner* — Robert Beausoliel, Jr.
*Assistant Examiner* — Michael Pham
(74) *Attorney, Agent, or Firm* — Dentons US LLP

(57) ABSTRACT

A method for applying adaptive data compression in a relational database system using a filter cascade having at least one compression filter stage in the filter cascade. The method comprises applying a data filter associated with the compression filter stage to the data input to produce reconstruction information and filtered data, then compressing the reconstruction information to be included in a filter stream. The filtered data is provided as a compression filter stage output. The method may comprise evaluating whether the compression filter stage provides improved compression compared to the data input. The filter stage output may be used as the input of a subsequent compression filter stage.

109 Claims, 15 Drawing Sheets

(56) References Cited

U.S. PATENT DOCUMENTS

| | | | |
|---|---|---|---|
| 5,938,763 A | 8/1999 | Fimoff et al. | |
| 5,946,692 A | 8/1999 | Faloutsos et al. | |
| 5,995,957 A | 11/1999 | Beavin et al. | |
| 6,012,054 A | 1/2000 | Seputis | |
| 6,014,656 A | 1/2000 | Hallmark et al. | |
| 6,014,670 A | 1/2000 | Zamanian et al. | |
| 6,023,695 A | 2/2000 | Osborn et al. | |
| 6,029,163 A | 2/2000 | Ziauddin | |
| 6,032,148 A * | 2/2000 | Wilkes | 1/1 |
| 6,092,091 A | 7/2000 | Sumita et al. | |
| 6,115,708 A | 9/2000 | Fayyad et al. | |
| 6,309,424 B1 * | 10/2001 | Fallon | 341/51 |
| 6,317,737 B1 | 11/2001 | Gorelik et al. | |
| 6,349,310 B1 | 2/2002 | Klein et al. | |
| 6,353,826 B1 | 3/2002 | Seputis | |
| 6,374,251 B1 | 4/2002 | Fayyad | |
| 6,470,330 B1 | 10/2002 | Das et al. | |
| 6,477,534 B1 | 11/2002 | Acharya et al. | |
| 6,513,041 B2 | 1/2003 | Tarin | |
| 6,633,882 B1 | 10/2003 | Fayyad et al. | |
| 6,671,772 B1 | 12/2003 | Cousins | |
| 6,691,099 B1 | 2/2004 | Mozes | |
| 6,754,221 B1 * | 6/2004 | Whitcher et al. | 370/401 |
| 6,865,573 B1 | 3/2005 | Hornick et al. | |
| 6,973,452 B2 | 12/2005 | Metzger et al. | |
| 7,024,414 B2 | 4/2006 | Sah et al. | |
| 7,051,038 B1 * | 5/2006 | Yeh et al. | 707/603 |
| 7,054,870 B2 | 5/2006 | Holbrook | |
| 7,080,081 B2 | 7/2006 | Agarwal et al. | |
| 7,154,416 B1 | 12/2006 | Savage | |
| 7,174,343 B2 | 2/2007 | Campos et al. | |
| 7,206,453 B2 * | 4/2007 | Lee et al. | 382/239 |
| 7,243,110 B2 * | 7/2007 | Grondin et al. | 1/1 |
| 7,257,571 B2 | 8/2007 | Turski et al. | |
| 7,353,218 B2 | 4/2008 | Aggarwal | |
| 7,401,104 B2 * | 7/2008 | Shah et al. | 707/620 |
| 7,590,641 B1 | 9/2009 | Olson | |
| 7,693,339 B2 * | 4/2010 | Wittenstein | 382/238 |
| 7,693,857 B2 * | 4/2010 | Dettinger et al. | 707/803 |
| 7,693,992 B2 | 4/2010 | Watson | |
| 7,724,307 B2 * | 5/2010 | Wan et al. | 348/620 |
| 7,747,585 B2 * | 6/2010 | Barsness et al. | 707/693 |
| 7,756,889 B2 | 7/2010 | Yu et al. | |
| 7,769,728 B2 * | 8/2010 | Ivie | 707/693 |
| 2001/0042167 A1 | 11/2001 | Egawa | |
| 2002/0007368 A1 | 1/2002 | Lee et al. | |
| 2003/0028509 A1 | 2/2003 | Sah et al. | |
| 2003/0074348 A1 | 4/2003 | Sinclair et al. | |
| 2003/0120644 A1 | 6/2003 | Shirota | |
| 2004/0039729 A1 | 2/2004 | Boger et al. | |
| 2004/0111410 A1 | 6/2004 | Burgoon et al. | |
| 2005/0065911 A1 | 3/2005 | Ellis et al. | |
| 2005/0102325 A1 | 5/2005 | Gould et al. | |
| 2006/0195464 A1 * | 8/2006 | Guo | 707/101 |
| 2007/0203925 A1 | 8/2007 | Sandler et al. | |
| 2008/0071748 A1 | 3/2008 | Wroblewski et al. | |
| 2008/0071818 A1 * | 3/2008 | Apanowicz et al. | 707/101 |
| 2008/0162523 A1 * | 7/2008 | Kraus et al. | 707/101 |
| 2008/0219575 A1 * | 9/2008 | Wittenstein | 382/238 |
| 2008/0219582 A1 * | 9/2008 | Kirenko | 382/261 |
| 2008/0270363 A1 | 10/2008 | Hunt et al. | |
| 2009/0043797 A1 | 2/2009 | Dorie et al. | |
| 2009/0106210 A1 | 4/2009 | Slezak et al. | |

OTHER PUBLICATIONS

A. Aboulnaga, P.J. Haas, S. Lightstone, G.M. Lohman, V. Markl, I. Popivanov, V. Raman. Automated Statistics Collection in DB2 UDB. Proceedings of the 30th VLDB Conference, 2004. 1158-1169.

S. Babu, P. Bizarro. Adaptive Query Processing in the Looking Glass. In Proceedings of the Conference on Innovative Database Research (CIDR), 2005. 238-249.

P. Boncz, M. Zukowski, N. NES. MonetDB/X100: Hyper-pipelining Query Execution. In Proceedings of the Conference on Innovative Database Research (CIDR), 2005. 225-237.

M. Cannataro, D. Talia. The knowledge grid. Commun. ACM 46(1): 89-93, 2003. [Extended 12-page version at http://grid.deis.unical.it/kgrid/].

M. Crochemore, R. Verin. On Compact Directed Acyclic Word Graphs. In Structures in Logic and Computer Science. Lecture Notes in Computer Science 1261, Springer, 1997, pp. 192-211.

M. Crochemore, R. Verin. Direct Construction of Compact Directed Acyclic Word Graphs. CPM 1997, pp. 116-129.

J.M. Hellerstein, R. Avnur, A. Chou, C. Hidber, C. Olston, V. Raman, T. Roth, P.J. Haas. Interactive data Analysis: The Control Project. IEEE Computer 32(8), 1999, pp. 51-59.

J.M. Hellerstein, P.J. Haas, H.J. Wang. Online Aggregation. SIGMOD Conference, 1997, pp. 171-182.

S. Inenaga, H. Hoshino, A. Shinohara, M. Takeda, S. Arikawa, G. Mauri, G. Pavesi. On-Line Construction of Compact Directed Acyclic Word Graphs. In Proceedings of the 12th Annual Symposium on Combinatorial Pattern Matching, pp. 169-180, 2001.

S. Inenaga, H. Hoshino, A. Shinohara, M. Takeda, S. Arikawa, G. Mauri, G. Pavesi. On-line construction of compact directed acyclic word graphs. Discrete Applied Mathematics 146(2), 2005, pp. 156-179.

W.H. Inmon. Information Lifecycle Management for Data Warehousing: Matching Technology to Reality—An Introduction to SAND Searchable Archive. White paper, 2005.

N.J. Larsson. Extended Application of Suffix Trees to Data Compression. Data Compression Conference (DCC), 1996, pp. 190-199.

R. Macnicol, B. French. Sybase IQ multiplex—designed for analytics. In VLDB, pp. 1227-1230, 2004.

V. Markl, P.J. Haas, M. Kutsch, N. Megiddo, U. Srivastava, T.M. Tran. Consistent selectivity estimation via maximum entropy. VLDB J. 16(1): 55-76 (2007).

MySQL. Enterprise Data Warehousing with MySQL. Business white paper, 2007.

Z. Pawlak, A. Skowron. Rudiments of rough sets. Information Sciences 177(1): 3-27, 2007.

QD Technology. The Quick Response Database by QD Technology: A Smart Relational Database Management Solution that Enables Easy and Fast Ad Hoc Queries. White paper, Apr. 2007.

D. Shkarin. PPM: One Step to Practicality. Data Compression Conference (DCC '02). IEEE Computer Society, Washington, DC, 2002.

M. Stonebraker, D.J. Abadi, A. Batkin, X. Chen, M. Cherniack, M. Ferreira, E. Lau, A. Lin, S. Madden, E. O'Neil, P. O'Neil, A. Rasin, N. Tran, S. Zdonik. CStore: A Column Oriented DBMS. In Proceedings of the Conference on Very Large Databases (VLDB), 2005.

M. Stonebraker, C. Bear, U. Cetintemel, M. Cherniack, T. Ge, N. Hachem, S. Harizopoulos, J. Lifter, J. Rogers, S. Zdonik: One Size Fits All? —Part 2: Benchmarking Results. In Proceedings of the Conference on Innovative Database Research (CIDR), 2007.

Vertica. The Vertica Database. Technical Overview White Paper. Sep. 2006.

European Search Report dated May 25, 2012 in related European Application No. EP 07815821 filed Sep. 13, 2007, 8 pages.

Aggarwal, ed., "Data Streams: Models and Algorithms," Springer, 2007; 364 pages.

Fred et al, "Data Clustering Using Evidence Accumulation," 16th International Conference on Pattern Recognition, 2002, Proceedings, vol. 4, p. 276-280.

Bhattacharjee et al., "Efficient Query Processing for Multi-Dimensionally Clustered Tables in DB2," Proceedings of the 29th VLDB Conference, 2003, 12 pages.

Boehm et al, "Outlier-robust Clustering using Independent Components," SIGMOD Conference '08, 2008, p. 185-198.

Bruno and Chaudhuri, "To tune or not to tune? A Lightweight Physical Design Alerter," In Proceedings of the Conference on Very Large Databases (VLDB '06) Sep. 12-15, 2006, p. 499-510.

Ester et al., "A Database Interface for Clustering in Large Spatial Databases," In Proceedings of the First International Conference on Knowledge Discovery and Data Mining (KDD-95), 1995, 6 pages.

Gueting, "An Introduction to Spatial Database Systems," VLDB Journal, 1994, vol. 3, p. 357-399.

Jain et al., "Data Clustering: A Review, ACM Computing Surveys," Sep. 1999, vol. 31, No. 3 pp. 264-323.

(56) References Cited

OTHER PUBLICATIONS

Padmanabhan et al., "Multi-Dimensional Clustering: A New Data Layout Scheme in DB2," SIGMOD Conference '03, 2003, p. 637-641.

Peters and Weber, "A Dynamic Approach to Rough Clustering," RSCTC 2008, LNAI 5306, Springer-Verlag, 2008, p. 379-388.

Salomon, "Data Compression", 3rd Edition, Springer-Verlag, 2004, Ch. 2.18.

Sayood, "Introduction to Data Compression," 3rd Edition, Morgan Kaufmann, 2005, Ch. 6.3.

Slezak et al., "Brighthouse: An Analytic Data Warehouse for ad hoc Queries," VLDB '08, 2008, 9 pages.

Zhang et al, "BIRCH: An Efficient Data Clustering Method for Very Large Databases," SIGMOD '96, 1996, p. 103-114.

Anonymous, Infobright Analytic Data Warehouse Technology White Paper, Jun. 2008, p. 1-15.

MySQL, "5.1 Reference Manual: Storage Engines", http://devl.mysql.com/doc/refman/5.1/en/storage-engines.html, last accessed Nov. 28, 2007.

* cited by examiner

METHOD AND SYSTEM FOR DATA COMPRESSION IN A RELATIONAL DATABASE

CROSS-REFERENCE TO RELATED APPLICATIONS

This application claims the benefit of U.S. Provisional Application No. 60/845,167, filed Sep. 18, 2006, the entirety of which is hereby incorporated by reference.

TECHNICAL FIELD

The present disclosure relates generally to a relational database management systems (RDBMS), and more particularly to a method and system for data compression in a RDBMS.

BACKGROUND

Databases and database management systems are being implemented in more and more businesses, organizations and institutions, and are being used to store and manage increasingly large amounts of data of increasingly different types and complexity. As a result, there is a need for improved database management solutions.

SUMMARY

A relational database management system (RDBMS) in which analytical information about data and relationships within data are utilized in query planning and execution is described along with methods for using such an RDBMS. Analytical techniques such as rough set analysis (RSA) techniques may be applied to this analytical information to attempt to minimize the amount of information required to resolve a query and/or determine the fastest approach to retrieve the necessary data to answer the query. In some instances, queries may be planned and executed based on the analytical information (e.g., statistical information) about the database without accessing the underlying data. Methods of compression and decompression may also be applied to data stored in such an RDBMS. Such methods may be optimized for the data.

In some aspects, there may be provided a method for applying adaptive data compression in a relational database system, the method using a filter cascade having at least one compression filter stage in the filter cascade, the method including: i.) providing data input to a compression filter stage of the filter cascade; ii.) evaluating whether the compression filter stage provides improved compression compared to the data input; iii.) applying a data filter associated with the compression filter stage to the data input if the compression filter stage provides improved compression, to produce reconstruction information and filtered data; iv.) compressing the reconstruction information to be included in a filter stream; and v.) providing the filtered data as a compression filter stage output for the compression filter stage.

In some aspects, the method may include the steps of: vi.) determining if additional compression filter stages exist for consideration; vii.) providing the compression filter stage output as the data input to a subsequent compression filter stage if additional compression filter stages exist; and viii.) repeating steps i.) to v.) for the subsequent compression filter stage.

In some aspects, the method may include the step of: ix.) repeating steps i.) through viii.) n times, where n is an integer representing the number of stages of compression filter stages in the filter cascade.

In another aspect, there may be provided a method for performing data compression using a filter cascade on data in a relational database, the method including the steps of: providing data input having a plurality of data elements; applying a first data filter of a first compression filter stage to the data input, producing reconstruction information and filtered data; compressing the reconstruction information and including the compressed reconstruction information in a filter stream; providing the filtered data as a compression filter output; and repeating the applying and compressing steps using the filter output as an input for at least one subsequent compression filter stage.

In some aspects, the method may include the steps of, before the applying step: evaluating whether a given compression filter stage would provide improved compression compared to the data input; and where evaluation of the given compression filter stage finds that the given compression filter stage does not provide improved compression, the given compression filter stage is not applied, and the evaluating step is repeated with at least one subsequent compression filter stage.

In another aspect, there may be provided a method for applying data compression for alphanumeric data in a relational database, the alphanumeric data including a plurality of alphanumeric characters, the method including the steps of: providing the alphanumeric data to a data compression module; determining a probability distribution for each character of the alphanumeric data using a suffix-prediction algorithm; and compressing the alphanumeric data using the probability distribution.

In another aspect, there may be provided a method of data decompression of compressed data in a relational database, the method including the steps of: providing a filter stream including compressed data that was compressed using the compression methods described above; retrieving from the compressed data the identity and order of the compression filter stages that were applied to the compressed data; and applying corresponding decompression filters for each of the compression filter stages in a reverse order in which the compression filter stages were applied during compression.

In another aspect, there may be provided a system for applying adaptive data compression in a relational database system, the system including: a database server including: a microprocessor for controlling operation of the database server; and a memory coupled to the microprocessor; the database server including a compression module resident in the memory for execution by the microprocessor, the compression module being configured to carry out the compression methods described above.

In another aspect, there may be provided a system for data decompression of compressed data in a relational database system, the system including: a database server including: a microprocessor for controlling operation of the database server; and a memory coupled to the microprocessor; the database server including a decompression module resident in the memory for execution by the microprocessor, the decompression module being configured to carry out the decompression method described above.

DESCRIPTION OF THE DRAWINGS

Throughout the Figures, like features are identified by like reference numerals.

DETAILED DESCRIPTION

The present disclosure provides a relational database management system (RDBMS) in which analytical information about data in a database may be used in query planning and execution. The analytical information may be determined from the data by mathematical techniques. Basic analytical information about the data may be used to provide advanced analytical information (i.e., higher level, more organized information) about the data and relationships within the data. Analytical information usually applied by conventional databases to single data values may be applied at the level of collections of values stored in data packs as described below.

Using basic and advanced information about the data, techniques such as rough set analysis (RSA) techniques may be used in query planning and execution. RSA techniques are mathematic techniques based on rough set theory for providing statistical information about raw data. RSA techniques apply mathematic analytical techniques to identify relationships between data and provide approximation data (e.g., rough sets) that represent these relationships. RSA techniques may also be used to generate and optimize the advanced information about the data to further improve query execution. Rough set theory can provide a theoretical basis for machine learning by which relationships may be identified in raw data. Analytical techniques, such as various RSA techniques, may be applied in the RDBMS.

The use of RSA techniques in query planning and execution seeks to improve query response times and extend query capabilities compared with traditional approaches to database management systems (DBMS). Using basic and advanced information about the data, RSA techniques allow the amount of data that needs to be accessed to resolve a database query to be minimized by first analyzing the basic and/or advanced analytical information to determine if this analytical information may be used, either entirely or in part, to resolve the query without accessing the underlying data. Further, when data needs to be accessed, the basic and/or advanced analytical information may assist in determining the optimal approach to retrieving the data necessary to answer the query. Further still, the basic and/or advanced analytical information about the data may provide useful information in managing or organizing the database, and may be used to extend standard functionality of the relational database management system by allowing "rough queries" based solely on the basic and/or advanced analytical information about the data.

Relational Database Management System

Figure 1:
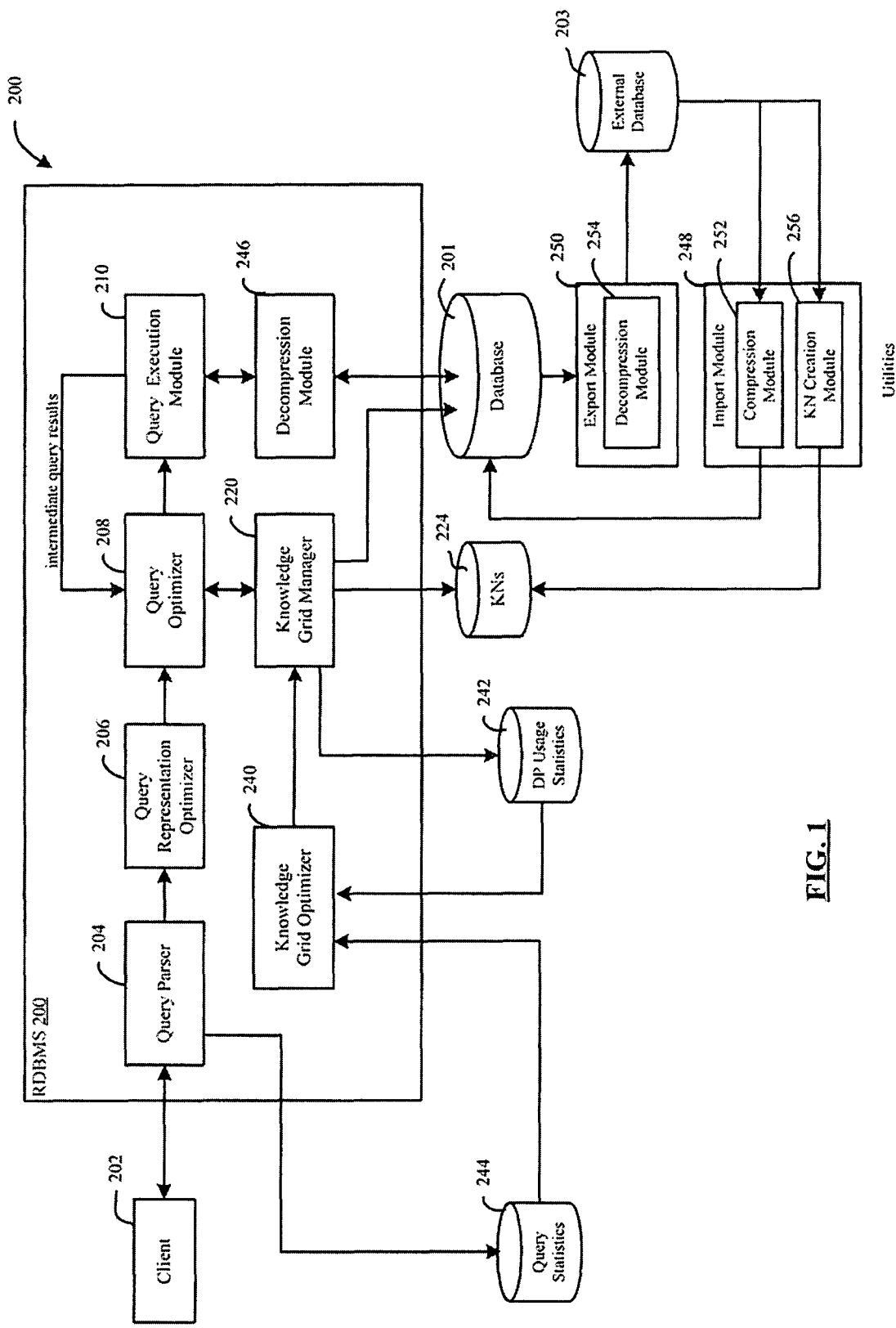
FIG. 1 is a schematic diagram of a relational database management system (RDBMS)

FIG. 1 is a schematic diagram of a relational database management system (RDBMS) 200. The example RDBMS 200 is described with reference to functional program modules for the purpose of illustration only, and is not intended to be limiting. When implemented, one or more of these functional modules may be combined into a single program module or may include two or more sub-modules. The RDBMS 200 may interface with a client application (also referred to as a client) 202 providing a query tool executed on a user terminal (not shown). The RDBMS 200 may be coupled to a database 201, which may be implemented using SQL (Structured Query Language), and may provide an interface, such as an SQL interface, to query tools for use via the client application 202. The SQL interface may manage the creation and management of database objects like tables, views and user permissions to those tables. Although only client application 202 is shown, multiple client applications 202 may be connected to the RDBMS 200. The client application 202 may provide a user interface (not shown) through which SQL requests and responses may be sent and received between the client application 202 and the RDBMS 200. The RDBMS 200 may include a Query Parser 204, a Query Representation Optimizer 206, a Query Optimizer 208 and a Query Execution Module 210.

The RDBMS 200 may also include functional program modules such as: connectors, connection pool, management services and utilities, caches and buffers, and file system. The functionality of these program modules will be understood by a person of ordinary skill in the art and so will only be briefly described. The connectors may provide various mechanisms/protocols for external tools to connect to the database. The connection pool may manage multiple clients connecting and making requests to the database. The connection pool may manage the concurrency of many requests competing for resources. The management services and utilities are supporting tools that may be used with the data to manage administration, settings, users, etc. The caches and buffers are lower level services that may be provided to all the system components which manage data in memory (e.g., Random Access Memory (RAM)) for query responses and optimizations among other functions. The file system may manage the storage device.

Figure 4:
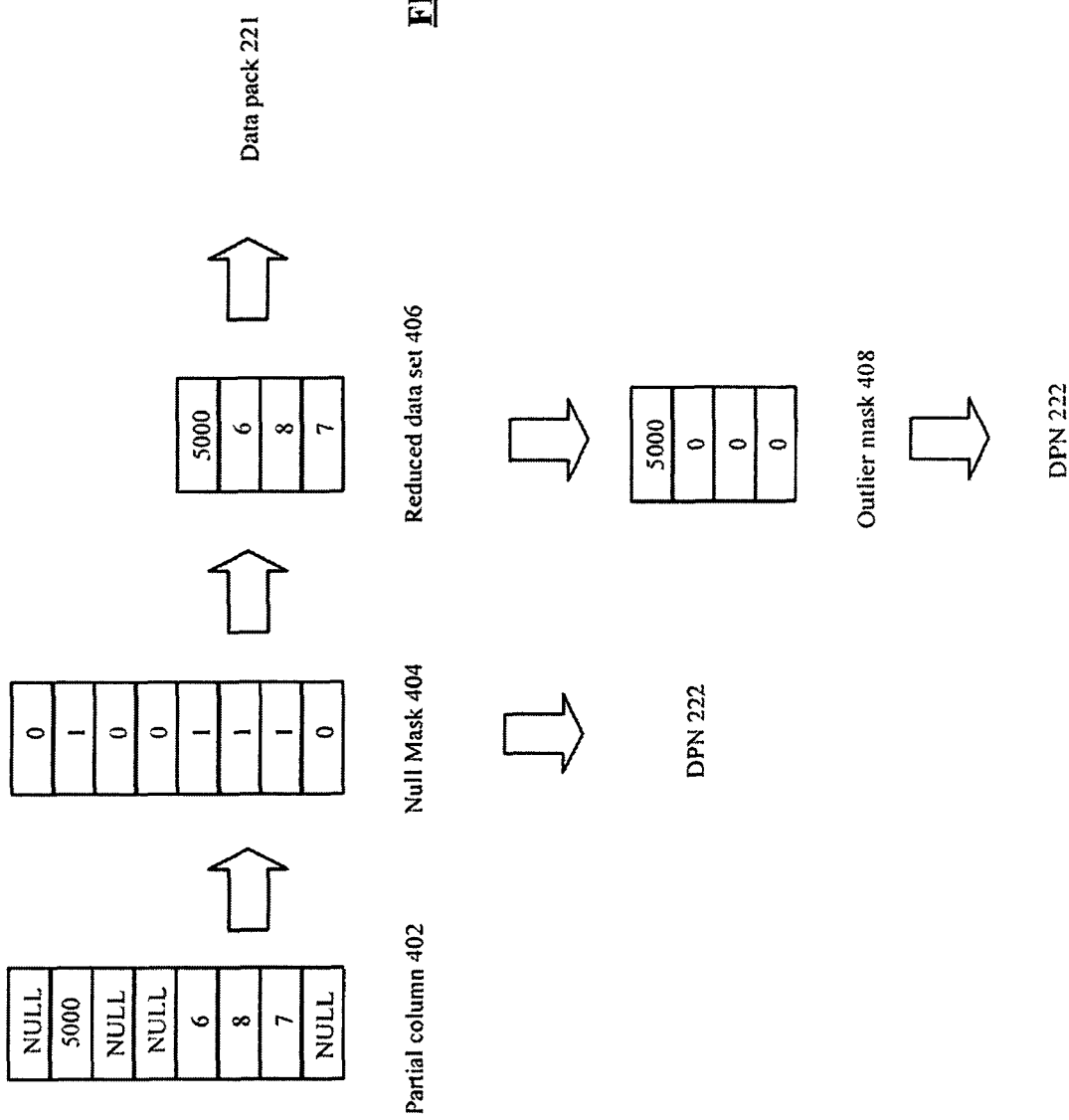
FIG. 4 is a schematic representation of a column being encoded during the operations of FIG. 3.

The database 201 may include one or more data packs (DP) 221 (see FIG. 4). In some aspects, the database 201 may be a column-oriented database 201, and the data packs 221 may each represent column data from a base table. The data packs 221 may include compressed data representing the records or entries in the respective column. The database 201 may be stored or partitioned on one or more data storage devices (not shown) such as a hard disk drive (HDD) or other suitable storage medium, which may be a permanent (i.e., nonvolatile) storage medium. In some aspects, the data packs 221 may contain data concerning up to 65,536 consecutive records or records occupying up to 64 k of storage space, of which some values may be null. Depending on the size of a column, it may be stored in more than one data pack (e.g., if the column has more than 65,536 records or requires more than 64 k of storage space). The data packs 221 may contain more or less records than discussed here, depending on the application.

Basic analytical information about data in a data pack 221 may be stored in a statistical data pack referred to as a data pack node (DPN) 222 (see FIG. 4) associated with each data pack 221 in the database 201. In some aspects, there may be one DPN 222 for each data pack 221. The data pack 221 and DPN 222 may be stored in the database 201 using a unique file name to uniquely identify the respective data pack 221, with different extensions to identify and locate the data pack 221 and DPN 222. Each DPN 222 nay contain basic information (e.g., statistics) about its respective data pack 221. The particular information maintained in the DPN 222 for each data pack 221 may depend on the particular data type of the respective data pack 221. Typically, the size of each DPN 222 may be small and so the DPN 222 may be not compressed. However, if the information contained in the DPN 222 becomes more complex or large, the DPN 222 may be compressed.

Generally, column data types may be at least one of: a string, a numeric value, a floating point value, or a binary value. A compression algorithm may be selected for each of these four primary data types. In some aspects, within each of these four primary data types there may be sub-types (e.g., large string, short string, or other) for which different compression algorithms may be selected. In some aspects, all numeric values, floating point values, and binary values may be stored as unsigned integers for the purpose of compression. For example, a negative decimal number may be converted to an unsigned integer, with certain indicators to mark that it is a negative decimal number. This can be reconstructed to recover the original number. By using only unsigned integers for storage, implementation of compression may be simplified by avoiding the need for different filters specific to a large number of data types. Of course, certain data filters, for example PartDict, may be able to process all data types. Data filters will be discussed in greater detail further below.

In accordance with an embodiment, at least the following SQL-compatible data types may be implemented (the particular format of each data type may be varied):

CHAR(x), VARCHAR(x)—String type (any characters, incl. \0, length up to 32767)
   INT—Numerical type, integer up to 32 bits
   SMALLINT—Numerical type, integer up to 16 bits
   BYTEINT—Numerical type, integer up to 8 bits
   DEC(x, y)—Numerical type, fixed precision (up to 18 digits)
   REAL, FLOAT—Floating point (64-bit)
   DATE—Numerical
   TIME—Numerical
   TIME(n)—Numerical (HH:MM:SS.[n digits], up to n=11)
   DATETIME—Numerical, date and time (fraction of sec. up to 6 digits)
   BYTE(x), VARBYTE(x)—Binary, up to 32767 bytes
   BIN—Binary, no encoding (BLOB), up to about 1 GB for single data pack In this example, for the data types INT, SMALLINT, BYTEINT, DEC, REAL, DATE, TIME, and in the case of lookup internal representations for the data types CHAR/VARCHAR, the DPN 222 for data packs 221 may include: the number of null and not null values in the respective data pack 221, the minimum and maximum values in the respective data pack 221, and (he sum of values (this is applicable to numerical data types only) in the respective data pack 221. If all non-null values in the data pack 221 are the same, the DPN 222 may store only the statistical information and positions of nulls. Additional or different information may be included in the DPN 222 in other aspects. Further, other information about the respective data pack 221 may be derived from tile information in the DPN 222. For example, the average value may be derived directly from the number of non-values and the sum of values which are both stored in the DPN 222 of the example.

For the data types BYTE, VARBYTE, BIN, and in the case of non-lookups for the data types CHAR, VARCHAR, the DPN 222 for data pack 221 may include: the number of null and not null values in the respective data pack 221.

The DPN 222 may be used in query planning and execution, and may allow minimization of the need to access the data stored in the respective data pack 221 during query execution, as will be described in more detail below.

Knowledge nodes (KNs) or knowledge node objects 224 may be also stored in the database 201 on the same or different storage device (e.g., HDD) as the data packs 221 and the DPNs 222. The KNs 224 are another type of statistical data pack, and may be directly associated with specific data packs 221 or DPNs 222. KNs 224 may include advanced analytical information about the data stored in a data pack 221 or across one or more data packs 221. The KNs 224 are optional in that they provide more detailed information about the data in the data packs 221 and relationship between the data. There are several types of KNs 224 that may be generated and stored, and new KNs 224 may be generated and added to the RDBMS 200 without impact or without significant impact to the basic functionality of the RDBMS 200. The KNs 224 may be dynamic and may change over time. KNs 224 provide information about data packs 221 that may extend beyond that provided by the DPN 222, such as information about relationships between data in multiple data packs 221, information about relationships between columns in a base table and/or relationships between columns in different base tables. Example KNs 224 are described below. Typically, the size of each KN 224 may be small and so KNs 224 may be not compressed, however if the information contained in the KNs 224 becomes more complex or large the KNs 224 may be compressed. Together, the DPNs 222 and KNs 224 for the database 201 form a knowledge grid (KG).

The database 201 may also have indices based on the data packs 221 analogous to database indices based on records. Most standard database indices may be adapted for the RDBMS 200 to be based on the data packs 221 rather than records.

The RDBMS 200 may further include a Knowledge Grid (KG) Manager 220 and a Knowledge Grid (KG) Optimizer 240. The Knowledge Grid Manager 220 is a functional program module that may manage the DPNs 222 and KNs 224. The Knowledge Grid Manager 220 works with the Query Optimizer 208 and Knowledge Grid Optimizer 240. The Knowledge Grid Manager 220 may generate, modify and remove KNs 224 based on instructions from the Knowledge Grid Optimizer 240. The Knowledge Grid Manager 220 may also be responsible for informing the Query Optimizer 208 about the available DPNs 222 and KNs 224 and may load them into memory from storage (e.g., HDD) as necessary. When loaded into memory, the Query Optimizer 208 may use information from the DPNs 222 and KNs 224 to determine the optimum query execution plan. Once loaded into memory the DPNs 222 and KNs 224 may also be used in the execution of the query execution plan as will be explained in more detail below.

The Knowledge Grid Optimizer 240 is a functional program module that may be used to determine an optimum set of KNs 224 based on query statistics 244 (which may be obtained from the Query Parser 204) and data pack usage statistics 242 obtained from the Knowledge Grid Manager 220. The query statistics 244 may allow the Knowledge Grid Optimizer 240 to identify data ranges and types of information about the data being queried. The query statistics 244 may be applied by the Knowledge Grid Optimizer 240 to determine which KNs 224 are the most useful for query execution. For example, the query statistics 244 maintain information on how frequently particular pairs of tables are joined, which may influence whether the corresponding pack-to-pack KN 224 should be stored in the knowledge grid.

Data pack usage statistics 242 may store information about the frequency and/or kind of usage (e.g., relevant, irrelevant, partially relevant) of data packs 221. Data pack usage statistics 242 may influence compression/speed ratios for particular data packs 221 and which data packs 221 are loaded directly into memory. Data pack usage statistics 242 may also be used to vary the content of the DPNs 222 for particular data packs 221. Data pack usage statistics 242 may be used to identify the respective data packs 221 of the data being queried.

Using the query statistics 244 and the data pack usage statistics 242, the Knowledge Grid Optimizer 240 may update the optimal set of KNs 224. If KNs 224 do not exist over a desired data range, the Knowledge Grid Optimizer 240 may determine that creation of one or more KNs 224 would improve query execution. In this case, the Knowledge Grid Optimizer 240 may instruct the Knowledge Grid Manager 220 to create one or more KNs 224 of a given type (e.g., create a histogram for a given data pack 221). If KNs 224 exist over a desired data range (e.g., for a given data pack 221) but, for example, the KNs 224 cannot be used to answer the most frequent queries over this range, the existing KNs 224 may be modified (e.g., histogram ranges expanded) or new KNs 224 may be created (e.g., create a Pack-Pack Join object) in order to provide sufficient statistics to satisfy such queries. In this case, the Knowledge Grid Optimizer 240 may instruct the Knowledge Grid Manager 220 to modify or create the relevant KNs 224. If KNs 224 exist, but the relevant data is infrequently or never queried, and hence the relevant KN 224 is infrequently or never queried, these KNs 224 may be deleted. In this case, the Knowledge Grid Optimizer 240 may instruct the Knowledge Grid Manager 220 to delete the relevant KNs 224. If such data becomes accessed or queried more frequently in the future, this may be detected by the Knowledge Grid Optimizer 240, which may instruct the Knowledge Grid Manager 220 to (re)create relevant KNs 224 if doing so will improve query performance.

The Knowledge Grid Optimiizer 240 may use one or more heuristic algorithms, including greedy, randomized, AI-based, and/or evolutionary algorithms, to determine the optimal set of KNs 224 to satisfy the most queries with the least amount of access to the data in the data packs 221, thereby minimizing the need to decompress the data packs 221 and load the raw data into memory. In one example, the Knowledge Grid Optimizer 240 may identify the most significant relationships within the data and then may determine an optimal set of KNs 224 to be maintained by the RDBMS 200. The Knowledge Grid Optimizer 240 may then instruct the Knowledge Grid Manager 220 to generate, modify and/or remove KNs 224 in accordance with the determined optimal set. Accordingly, the KNs 224 may be dynamic and change over time in accordance with the query statistics 244 and the data pack usage statistics 242. In addition, because the KNs 224 may contain analytical information about the data rather than actual data, the KNs 224 may be deleted or lost without compromising data integrity.

The Query Parser 204 may receive SQL queries, sometimes referred to as requests or SQL statements, from the client application 202. The Query Parser 204 parses or separates the SQL query received from the client application 202 and converts it into an internal representation usable by the RDBMS 200. The Query Parser 204 may forward this internal representation to the Query Representation Optimizer 206.

The Query Representation Optimizer 206 may perform a syntactical optimization of the query. The Query Representation Optimizer 206 replaces any references to views with references to the underlying base tables and reformats the query to attempt to make it easier to execute based on the structure of the query request. The Query Representation Optimizer 206 may forward this optimized representation to the Query Optimizer 208.

The Query Optimizer 208 may optimize the query for execution using analytical information from the DPNs 222 and KNs 224 relating to the underlying data (e.g., column, table, or view described in the original SQL query) provided via the Knowledge Grid Manager 220, and from intermediate query results obtained from the Query Execution Module 210 as will be described in more detail below. The Query Optimizer 208 may prepare the query for execution by preparing a query execution plan. If intermediate query results are obtained from the Query Execution Module 210, the Query Optimizer 208 may modify the initial query execution plan based on these intermediate results. The Query Optimizer 208 may forward the initial and any modified query execution plans to the Query Execution Module 210 for execution.

The Query Execution Module 210 may execute the initial and any modified query execution plans provided by the Query Optimizer 208. The Query Execution Module 210 may also be coupled to the Knowledge Grid Manager 220 so as to provide access to the analytical information of the DPNs 222 and KNs 224 for use in answering the query. The Query Execution Module 210 may, if the query cannot be resolved solely from the basic and/or advanced analytical information in the DPNs 222 and/or KNs 224 respectively, use retrieved data from storage (e.g., HDD) by decompressing the relevant data packs 221 in the database 201 using a Decompression Module 246. A file system (not shown) may be responsible for storing and retrieving data from data packs 221 in storage and compressing/decompressing the data packs 221 as required.

The RDBMS 200 may further include import module 248 and export module 250. The import module 248 may be used to encode raw data from base tables obtained from an external database or data source 203 into data packs 221. The export module 250 may be used to decode data packs 221 into underlying base tables for exporting to the data source 203. As part of the encoding/decoding operation, the data in the data packs 221 may be compressed/decompressed. Compression may be performed by the compression module 252 in the import module 248, and decompression may be performed by the decompression module 254 in the export module 250. The compression and decompression may use the filter cascade described below. The compression process may use a compression algorithm selected to optimize the compression ratio of a column, and may be selected according to the data type of the respective column. Possible compression algorithms encode the data and may use common coding methods known in the art including: arithmetic coding, range coding, Shannon-Fano-Elias coding, Shannon coding, Huffman coding, Rice coding, Golomb coding, Tunstall coding, and prediction by partial matching (PPM). Other codes or compression algorithms may be suitable. DPN information about the column may be used to vary parameters (for example, to apply or not apply various parameters) of the selected compression algorithm. A complementary decompression algorithm may be used when the data packs 221 are decoded for export or query resolution when data about individual data packs is required. The importing operation may optionally include creation of KNs 224, using the KN Creation Module 256 in the import module 248. Compression and decompression of the data will be discussed in greater detail below.

The database content and metadata may be stored in several types of files: (1) column description files; (2) data files; and (3) knowledge node description files.

The column description files contain a description of the column which may include: its data type, DPN information, and data pack localization. The data pack localization information associates each column with a respective data pack identifier (ID) such as a file name or number and file offset in cases where each data file contains more than one data pack. The session information may enable identification of the sessions in which the given data pack was created or modified. The column description file may be a relatively small file, typically several kB in the present embodiment, which is loaded into memory when the respective column is used for the first time. The column description file is used to locate and decode data packs 221 by identifying the associated data pack 221 and data type so as to identify the relevant decompression algorithm. In some situations, the metadata which may include the column description files from memory may be sufficient to determine the content of the data pack (e.g. nulls only, all values identical) in which cases the data file may be empty.

The data files contain the compressed column data. The data files may be stored with the column description file, although they may be stored in a different location (e.g., different storage device, etc.). In some aspects, the data files may be limited to 1.5 GB in size, or some other suitable size depending on the application, to improve read times. Each data file may contain data for two or more data packs 221, where each data pack 221 in the data file occupies a continuous space. The number of data packs 221 that may be stored in one file varies depending on the size of each data pack 221, which may be influenced by data type, number of nulls, and compression ratio. When reading data from a data pack 221, the file system may only need to decompress the part of the data file associated with the relevant data pack 221. Advantageously, storing more than one data pack 221 in one data file may allow faster read times (e.g., lines for decoding and loading of data pack data into memory for access during query execution) than if each data pack 221 were stored separately. Additionally, storing larger collections of data packs 221 together in files may improve the access speed. If each data pack 221 were stored in a separate file, the access speed may be reduced.

The knowledge node description files store information about the KNs 224. Each KN description file describes a separate KN 224, allowing individual KNs 224 to be created, modified, or removed by the Knowledge Grid Manager 220 without affecting other objects, such as other KNs 224. This may improve the ability to manage (e.g., by creation or deletion of KNs 224) the KNs 224 of the database 201. The KN description files may be stored on the same or different storage device (e.g., HDD) as the column description files and data files. The KN description files are loaded into memory on the first use of the KNs 224, however the Knowledge Grid Manager 220 may load and remove KNs 224 from memory in accordance with usage of such KNs 224. The KN description files are not necessary for data decoding, and may therefore be lost or restored at any time.

All of the data files may be subject to memory management. Once the column metadata (e.g., column description files), data pack (e.g., data file) 221 or KN (e.g., KN description file) 224 is loaded into memory, it may be kept in memory as long as it is being used, and may be kept by the memory manager for future use. When the available memory becomes low, the less used objects may be removed from memory, as managed by the Knowledge Grid Manager 220.

Query Example

Figure 2:
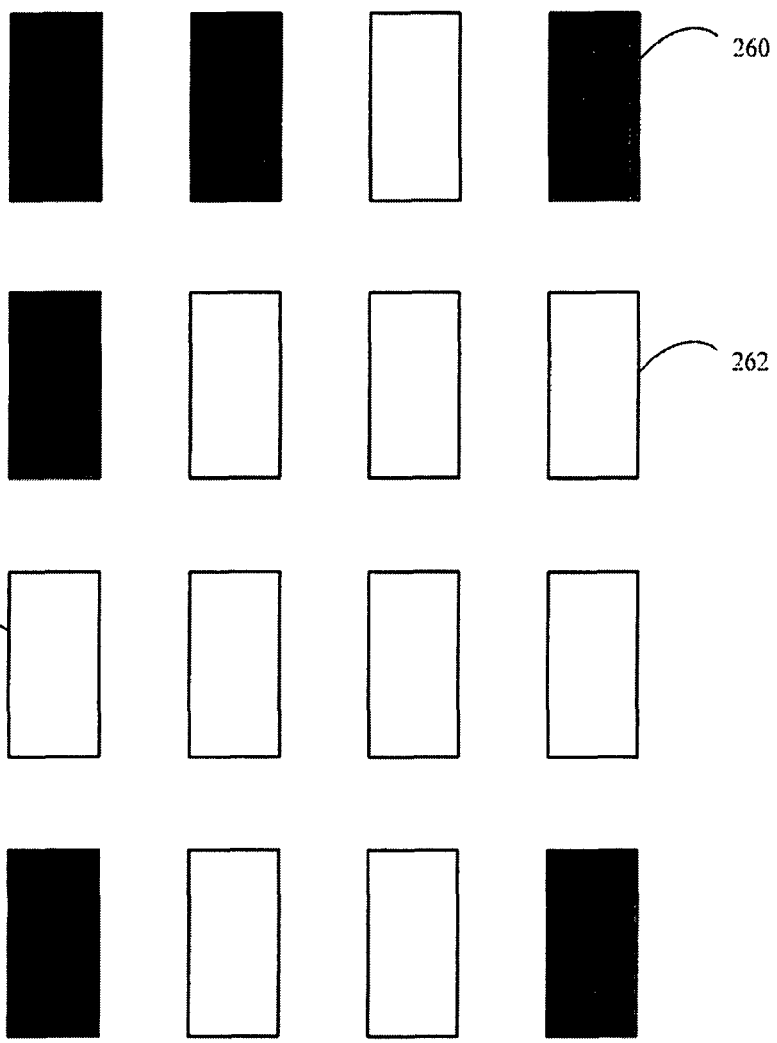
FIG. 2 is a schematic representation of a data pack consisting of compressed column-data stored in a database.

FIG. 2 illustrates an example query using data packs and analytical information in the DPNs 222. FIG. 2 represents data packs including compressed column-data stored in the database 201. The following example query is to be solved using the database 201:

SELECT COUNT(*) FROM . . . WHERE A>5;

For the purposes of this example, the data packs in the database 201 can be separated into three categories: BLACK data packs 260 are not relevant to the query; GREY data packs 262 are partially relevant to the query, so they need to be accessed to answer the query because some of the elements of the data packs 262 may be relevant and some other elements may be irrelevant; and WHITE data packs 264 are relevant to the query and do not need to be accessed to answer the query because the answer can be determined directly from the respective DPN 222.

The BLACK data packs 260 each have a maximum value of less than 5 on A (e.g., some may have a maximum of 4, others 3, and yet others 2 or 1). These data packs are not relevant to answering the query because all of the data in these data packs 260 falls outside the query, because the maximum value of A of all records stored in the data packs 260 is 4 which is less than the query restriction of A >5. The BLACK data packs 260 are said to be disjoint with the query.

The WHITE data packs 264 each have a minimum value greater than 5 on A (e.g., some may have a maximum of 6, whereas others may be 7 or 10, etc.) on A. These data packs 264 are relevant to answering the query because the value of A for all records in these data packs 264 is greater than or equal to 6 which is greater than the query restriction of A >5. If the information in the DPNs 222 about the WHITE data packs 264 indicates the number of records, then this information can be summed to partially resolve the query for the WHITE data packs 264. The GREY data packs 262 each have a minimum value of 3 and a maximum value of 7 on A. These data packs 262 are also relevant to answering the query because some of the records in these data packs 262 have a value which is greater than 5 on A, while some records in these data packs 262 have a value of less than 5 on A. Thus, only the WHITE and GREY data packs 264, 262 are relevant to answering the query. The BLACK data packs 260 are not needed.

in the above example, information to answer the COUNT (*) query can be obtained from information regarding how many records from particular data packs satisfy the filter A >5. Thus, for BLACK data packs 260 the answer is automatically known to be zero. For WHITE data packs 264, we know that all records inside should be counted. The number of non-null values is stored in the DPN 222 for a numeric data type so this number can be taken and summed for all of the WHITE data packs 264. Only for the GREY data packs 262 is the number of how many of the non-null values that are actually greater than 5 not known using information from the DPNs 222, and hence the GREY data packs 262 need to be decompressed to get detailed information about every single value in the GREY data packs 262. The above example is provided for the purpose of illustration only, and is not intended to be limiting.

Data Pack Generation

Figure 3:
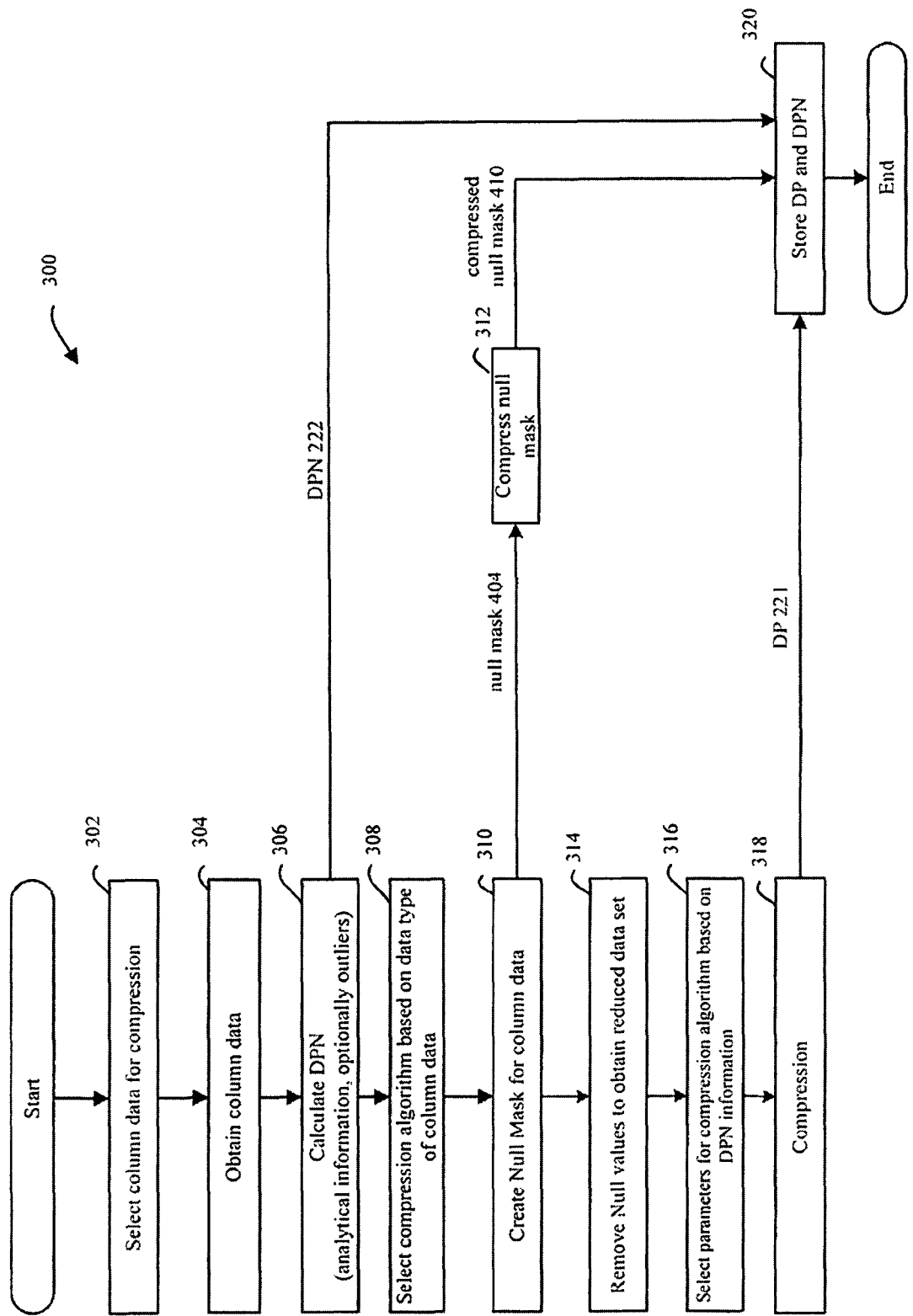
FIG. 3 is a flowchart illustrating operations of a method for generating data packs.

FIGS. 3 and 4 illustrate operations 300 of a method for generating data packs in accordance with an embodiment. The operations 300 illustrate the generation of a single data pack 221. If more than one data pack 221 is needed, for example when a base table is being imported into the RDBMS 200, then the operations 300 must be repeated until the entire base table has been encoded into data packs 221. Although the particular compression algorithm may vary between data packs 221, the same steps 302-320 will be preformed for each column of the base table irrespective of the applied compression algorithm. FIG. 4 shows a partial column 402, its corresponding null mask 404, and a reduced data set 406 generated by removing the null positions indicated in the null mask 404 from the partial column 402.

In the first step 302, a column data from a base table to be encoded is selected, for example, when raw data from a base table is being imported into the RDBMS 200. Next, in step 304 column data is obtained. In some aspects, each data pack 221 may hold records for up to 64 k (65,536) of storage space. Alternatively, each data pack 221 may hold 65,536 records. The data pack 221 may hold more or less records than described here, depending on the application. If the column contains less then 64 k of records, the column may be padded with null values to create a total of 64 k column, or the column may be left with less than 64 k of records, as an incomplete column. If the column contains more than 64 k of records, two or more data packs may need to be generated in order to compress the entire column. In other aspects, the data packs 221 may be able to handle more than 64 k of records. Similar operations may be carried out where each data pack 221 is designed to hold 65,536 records. While a value of 64 k is used in this example for the size of each column, columns of any size may be used in order to meet the requirements of a particular application.

Next, in step 306 basic analytical information for the column data to be stored in the respective DPN 222 is calculated. Optionally, prior to calculating the DPN information the column data may be analyzed for outliers. If any outliers are detected, they form part of the DPN information stored in the DPNs 222. In addition, if any outliers are detected they may be not considered in determination of the other DPN information (e.g. null, non-null, maximum and minimum where applicable, and sum where applicable). Outliers are values which do not match the general pattern or trend in a given column. Outliers may be, for example, infrequently occurring symbolic values or extreme values. In the example of FIG. 4, an outlier is the value 5000 which is an extreme value compared to the other values in the column set (i.e., 6, 7 and 8). Outliers may be detected using heuristic methods including methods commonly known in the art, which may be similar to those used in the Knowledge Grid Optimizer 240 described above (e.g., greedy, randomized, AI-based, evolutionary etc.). If detected, the outliers are stored in the DPN 222 and an outlier mask 408 which tracks the positions of outliers to non-null values is stored in the data pack 221.

Next, in step 308 a suitable compression algorithm may be selected based on the data type of the column. In some aspects, for each data type implemented in the RDBMS 200 a compression algorithm is pre-selected. Next, in step 310 a null (bit) map or null mask 404 (FIG. 4) is generated. Next, in step 312 the null mask is compressed using a compression algorithm suitable for binary sequences since the null mask 404 is binary regardless of data type of the reference column.

Next, in step 314 the null mask 404 is used to remove null values from the column to generate a reduced data set 406 consisting of only non-null values. The null mask 404 provides a map of the null value positions and non-null value positions so that null value positions may be removed from the column. As will be described in more detail below, the null mask 404 is stored in the data pack 221 for subsequent use in decompression.

Next, in step 316 the DPN information is used to determine parameters of the selected compression algorithm based on value patterns identified in the reduced data set 406. The Knowledge Grid Manager 220 also provides input regarding whether the data in a given data pack 221 may be more highly compressed, for example because it is not used frequently, which may permit a high compression ratio to be utilized at the expense of decompression speed, or when decompression speed should be favoured at the expense of compression ratio because the data in a data pack 221 is used frequently. The DPN information may be used to tune the parameters and optimize the compression ratio within every single data pack 221 based on intrinsic patterns in the reduced data set 406. Next, in step 318, the reduced data set 406 column data is compressed using the selected compression algorithm with the compression parameters determined in step 316, thus creating a DP 221. Next, in step 320 compressed (non-null) column data, the compressed null mask 410, outlier mask 408 (if any), compression parameters, and any intermediate results of the compression algorithm (if any) are stored together in the data pack 221, and a DPN 222 is stored in non-volatile memory (e.g., HDD).

The steps 302 to 320 are then repeated for the next column, or next portion of the column, until all data in the base table to be encoded and stored has been processed via the operations 300.

Figure 5:
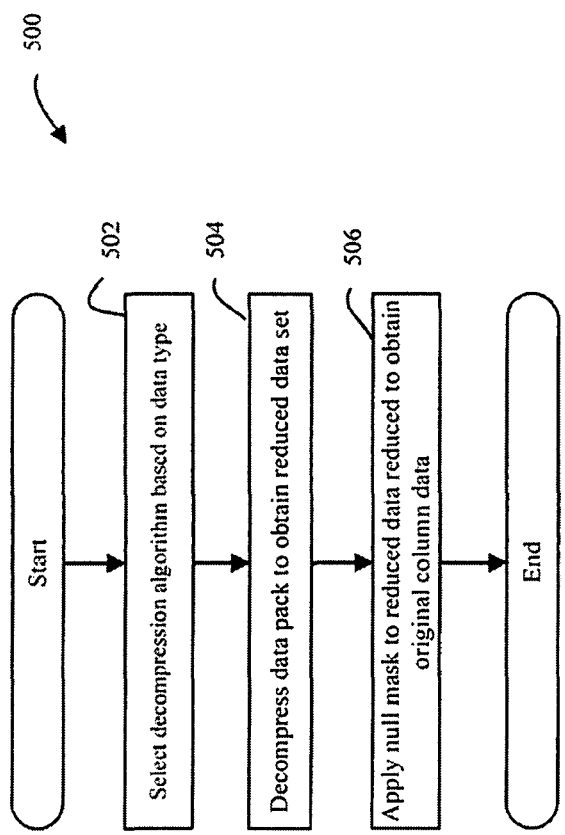
FIG. 5 is a flowchart illustrating operations of a method for decoding data packs.

FIG. 5 illustrates operations 500 of a method for decoding data packs 221 in accordance with an embodiment. Decoding operations 500 may occur, for example, during execution of a database query in which access to data in the data packs 221 is needed or during export operations in which raw data from the RDBMS 200 is exported to the external database/data source 203. In the first step 502, an appropriate decompression algorithm is selected for the data pack 221 to be decoded based on its data type as determined from the column description file associated with the data pack 221 and maintained by the RDBMS 200. Compression parameters and any intermediate results of the compression algorithm (if any) which are stored in the data pack 221 are used by decompression algorithm, to decompress the data pack 221.

Next, in step 504 the compressed data in the data pack 221 is decompressed to produce a reduced data set 406 (FIG. 4). Next, in step 506 the null information stored in the associated DPN 222 (i.e., the null mask 404) is applied to the reduced data set in order to produce the original column data.

Although the above description refers to compression and decompression involving filtering of the outliers and null values, other filtering methods are possible, and may be selected depending on the data. These other methods will be discussed in greater detail.

Multi-column Encoding

In addition to encoding a single column, data packs 221 may be encoded based on functional dependencies between columns within a base table or across base tables. To accommodate multi-column compression, descriptions of these functional dependencies may be stored instead of the actual data for each column. For example, if it is determined that whenever column A has value x, column B has value y, then the value of y does not need to be explicitly stored. The value x in column A may be encoded into data packs in accordance as described above along with a description of the functional dependency between columns A and B (i.e. the relation x=y). This relation may occur within the context of a single base table or between columns in different base tables.

At the knowledge node level, if a multi-column dependency is known, it can be used to minimize the number of data packs 221 to be decompressed. For example, if the values of column A are always greater than those of column B, during the execution of a query with Filter A=5, then internally the additional Filter B<5 may be generated by the Query Optimizer 208 to be used against the DPN information for the data packs 221 for the column B.

Techniques, including RSA techniques, and methods that may be common in the art (e.g., neural networks, fuzzy logic, rough set reduct, statistical regression, etc.) may be used to identify functional dependencies between data. Alternatively, functional dependencies may be input from existing database indices when data is imported into the database 201. Optimization criteria for identifying functional dependencies may also be modified to search for inexact functional dependencies, such as where there are exceptions to the relationship between the data or a trend/pattern in the data (e.g., outliers as described above). In the case of inexact functional dependencies, the description of the relationship and any exceptions or special cases may be stored in the data pack 221 along with the data of at least a reference column in accordance with the operations 300 described above. For example, if x=y for columns A and B respectively, except for 2 records, the exceptional records (e.g., outliers) may be stored along with the relation x=y in the respective data pack 221.

Thus, a mathematical dependency model may be generated based on one or more functional dependencies describing an inexact functional relationship between data in columns A and B that allows, with the input of values of some subset of data in column A, the output of approximations of the actual values of the corresponding subset of data in column B. This dependency model may then be modified to optimize the compression ratio of data of column A to be compressed during encoding operations using the particular compression algorithm applied for a particular data type, provided that the resulting approximation of the actual data of column B is within the specified tolerance for the given application. The above examples are for illustration purposes only, and are not intended to be limiting.

Knowledge Nodes (KNs)

Some KNs 224 will now be described. Other KNs 224 are also possible. The KNs 224 described below are provided for the purpose of illustration only and are not intended to be limiting. In general, KNs 224 can provide statistical and relational data between columns in the database 201 or among data packs 221 in a single column.

Value-pack Histogram (HIST)

The scope of the HIST object or HIST knowledge node may be a single numerical column. The HIST object contains binary information about the existence of a given value, or any value from a given interval, in the respective data pack 221. The HIST object is used, for example, to refine condition checking (e.g., exclusion of a data pack 221 when it is known that a specific value is not present within that data pack 221) and joining (e.g., exclusion of pairs of data packs 221 when their histograms are disjoint).

The HIST object stores binary information about whether the data pack 221 has any data elements with values in a given interval. The default number of intervals may be 1024, excluding minimum and maximum values, or it may be some other number. The intervals may be fixed-sized intervals, depending on minimum and maximum values in a pack. Alternately, the intervals may be of variable size, such as with smaller intervals where the values have a higher distribution and larger intervals where the distribution is lower, for example where the values have a bi-modal distribution. The interval sizes may also be variable depending on what range of values have a higher frequency of queries. If the difference between the minimum and maximum values is less than the default or selected number of intervals, and the column is fixed-size (e.g., integer or decimal), then exact data values may be used as the intervals.

The HIST object may implement a function called IsValue (v1, v2) where v1 and v2 are two numerical values defining an interval. The result of the function may be one of three values: RS_NONE if none of the entries in a data pack have a value within the interval defined by v1 and v2; RS_SOME if some of the entries in a data pack have a value within the interval defined by v1 and v2; and RS_ALL. if all of the entries in a data pack have a value within the interval defined by v1 and v2.

Figure 6A:
FIG. 6A is a schematic diagram illustrating an example of a HIST knowledge node.

One example of this knowledge node is illustrated in FIG. 6A. In this example, data elements 602 have a minimum value of 1 and a maximum value of 9. Since the difference between the minimum and maximum values is less than the default resolution of 1024, the exact values are stored. The HIST object 604 uses binary values to indicate the presence of certain values (i.e., 1, 2, 3, 5, 6 and 9) with a 1 bit. In this example, IsValue(1, 4) would return RS_SOME. IsValue(7, 8) would return RS_NONE, and IsValue(1, 9) would return RS_ALL.

Pack-Pack Join (JPP)

The scope of the JPP object may be any two columns from different base tables. The JPP object contains binary information about whether a given pair of data packs 221 containing column data from different base tables has any common value, except nulls. Tile JPP object may be used, for example, as an additional criterion while joining to exclude pairs of data packs 221 which are not joinable.

The JPP object may implement a function called GetValue (p1, p2) where p1 and p2 refer to two data packs 221. The result of the function may be a Boolean: True where data packs p1 and p2 may have non-empty intersection, and False where data packs p1 and p2 have no common values.

Character Map (CMAP)

The scope of the CMAP may be a single text column. The CMAP object is a binary map indicating existence of any character at any position. For example, for every position is (which may be limited to up to 64 characters) a binary string of 256 bits (32 bytes) is prepared. The size of the binary string may be different, depending on the application. A value '1' on character i means that there is at least one record in the data pack 221 for which there exists character i on position n. Characters at positions starting from 65 may be ignored, although the number of positions considered may be greater or smaller, or there may be no limit. The CMAP object may be larger than the HIST object for numerical values, but may be used for many optimizations, serving as statistics for sorter definitions and providing quick answers for sonic queries with LIKE and other text predicates.

The CMAP object may implement a function called IsValue(v1, v2) where v1 and v2 are two string values defining an interval. The result of the function may be one of three values:

RS_NONE if none of the entries in a data pack have a value within the interval defined by v1 and v2; RS_SOME if some of the entries in a data pack 221 have a value within the interval defined by v1 and v2, and RS_ALL if all of the entries in a data pack 221 have a value within the interval defined by v1 and v2.

The CMAP object may also implement a function called IsLike (string) where string is a string instance that CMAP looks for in the column. The result of the function may be one of three values: RS_NONE if none of the entries in a data pack 221 matches the pattern; RS_SOME if some of the entries in a data pack 221 match the pattern; and RS_ALL if all of the entries in a data pack 221 match the pattern.

The CMAP object may also implement functions called GetMin (pack) and GetMax (pack) where pack is a data pack 221 in the database 201. The result of these functions may be a string composed of the minimum or maximum characters of the histogram at every position in the data pack 221 for the GetMin (pack) and GetMax (pack) functions respectively.

Figure 6B:
FIG. 6B is a schematic diagram illustrating an example of a CMAP knowledge node.

One example of this knowledge node is illustrated in FIG. 6B, where data elements 606 result in CMAP object 608. In this example, CMAP object 608 may be case-insensitive, meaning that CMAP object 608 will indicate the presence of a certain character with a 1 bit regardless of whether it is uppercase or lowercase. Hence, the element "Banana" results in a 1 bit indicator for "B" at position 1 and for "A" at positions 2 and 4. In other implementations, CMAP object 608 may be case sensitive, may include special symbols, and/or may include numerical data. While tie CMAP object 606 is only shown with letters A-I and positions 1-4, any combination of alphanumeric characters, typically all letters of the alphabet, may be included, and any number of character positions may be included.

Examples of use of Knowledge Nodes

Examples illustrating the use of KNs 224 will now be described. These examples are provided for the purpose of illustration only and are not intended to be limiting. Assume there are two base tables, table T and table X. Table T includes columns A, B and C (there may be more in table T, but they are not relevant to the example). Columns A and C contain numeric data. Column B contains string data. Each of columns A, B and C in table T is represented by 5 data packs for every column as illustrated below:

TABLE T

| Column A (numeric) | Column B (string) | Column C (numeric) |
| --- | --- | --- |
| Data pack 1 | Data pack 1 | Data pack 1 |
| Data pack 2 | Data pack 2 | Data pack 2 |
| Data pack 3 | Data pack 3 | Data pack 3 |
| Data pack 4 | Data pack 4 | Data pack 4 |
| Data pack 5 | Data pack 5 | Data pack 5 |

Table X includes columns D and E. Columns D and E contain numeric data. Each of columns D and E in table X are represented by 3 data packs for every column as illustrated below:

TABLE X

| Column D (numeric) | Column E (numeric) |
| --- | --- |
| Data pack 1 | Data pack 1 |
| Data pack 2 | Data pack 2 |
| Data pack 3 | Data pack 3 |

Character Map (CMAP)
Consider the following query:
SELECT MAX(A) FROM T WHERE B='good';
Assume that the data pack 1 for column A has a MAX=5, data pack 2 for column A has a MAX=2, data pack 3 for column A has a MAX=8, data pack 4 for column A has a MAX=5, and data pack 5 for column A has a MAX=10. For every data pack for column B, the function IsLike ('good') is executed. Assume the following results: data pack 1 for column B has a result=RS_ALL, data pack 2 for column B has a result=RS_SOME, data pack 3 for column B has a result=RS_NONE, data pack 4 for column B has a result=RS_NONE, and data pack 5 for column B has a result=RS_SOME.

Combining the above information about A and B indicates the following:

Data pack 1 for column A has MAX=5, so no decompression is needed because all data relevant (all data records in data pack 1 for column match).

Data pack 2 for column A has a MAX=2, so these records are ignored irrespective of the data in column B since we already know that MAX(A) will be at least 5 because of results from the data pack 1 on A. Hence no decompression is needed.

Data packs 3 and 4 for column A are not relevant, because these were excluded by the filter on column B since there was no match on column B.

Data pack 5 for column A and B requires decompression because the number of relevant values (all/none) cannot be determined. For A some records have A>5, and for B some of the records match, but it cannot be said whether there is a match where A>5, and if so the MAX(A) cannot be determined.

Thus, the final result of the query will be the maximum of 5 (from data pack 1 on column A) and the result of the analysis of data pack 5 (i.e., the maximum value subject to the filter B='good' for single records in the data pack).

Pack-Pack Join (PPJ) and Value-Pack Histogram (HIST)
Consider the following query:
SELECT MAX(T.A) FROM T JOIN X ON T.C=X.D WHERE T.B+'good' AND X.E<5;

The filter B='good' may be applied in table T in the same manner as in the previous example. Hence, only data packs 1, 2 and 5 from table T are going to participate in the calculations. Now for every data pack for column E in table X we apply the HIST object's function IsValue(5, n) where n equals the maximum value for column E in table X (which is determined from column E's DPNs 222). Assume the following results:

Data pack 1 for column E has a result of RS_SOME,
Data pack 2 for column E has a result of RS_ALL, and
Data pack 3 for column E has a result of RS_NONE.

Therefore, data pack 3 for column E can be ignored in further calculations as none of the records are relevant. Going further to the JOIN operation, we know that the data packs to be involved are data pack 1, 2 and 5 for column C in table T, as well as data packs 1 and 2 for column D in table X. Consider that JPP for T.C and X.D is given and it results as follows for function GetValue (C's data pack from table T, D's data pack from table X):

Data pack 1 on column C and data pack 1 on D is false,
Data pack 1 on column C and data pack 2 on D is false,
Data pack 2 on column C and data pack 1 on D is true,
Data pack 2 on column C and data pack 2 on D is false,
Data pack 5 on column C and data pack 1 on D is true, and
Data pack 5 on column C and data pack 2 on D is false.

Thus, the results narrow down the column C's data packs which are going to participate in the calculation of MAX (T.A) to data packs 2 and 5 because the elements of data pack 1 are not going to occur in a joined table (neither with elements of data packs 1 nor 2 for D). Hence, data packs 2 and 5 for column A are decompressed and the maximum is calculated subject to the filter B='good' in table T.

Compression Algorithms

The compression of column data within data packs 221, as opposed to compressing entire columns, may yield higher compression ratios than if an entire column where compressed because of the ability to identify relationships or redundancies within each data pack 221 that may not exist over the entire column, thereby providing a basis for a potential higher compression ratio within the data pack 221.

To compress a sequence of data elements, relationships or redundancies are found between the elements. There may be many possible relations, applicable to numeric values, alphanumeric values, or both, non-limiting examples of which are as follows:

1. All numbers fall into the same range [min, max];
2. Some values may appear frequently in the sequence (frequent values);
3. A group of bits (usually the highest, sometimes the lowest) may be similar in all elements of the sequence or may have highly non-uniform distribution;
4. A group of bits at a given position in each element may have highly non-uniform distribution;
5. Repetitions may occur frequently;
6. Neighbouring elements may be correlated;
7. All elements may be divisible by the same value>=2; and
8. A few elements may take very different values than the rest.

Filter Cascade

Figure 7A:
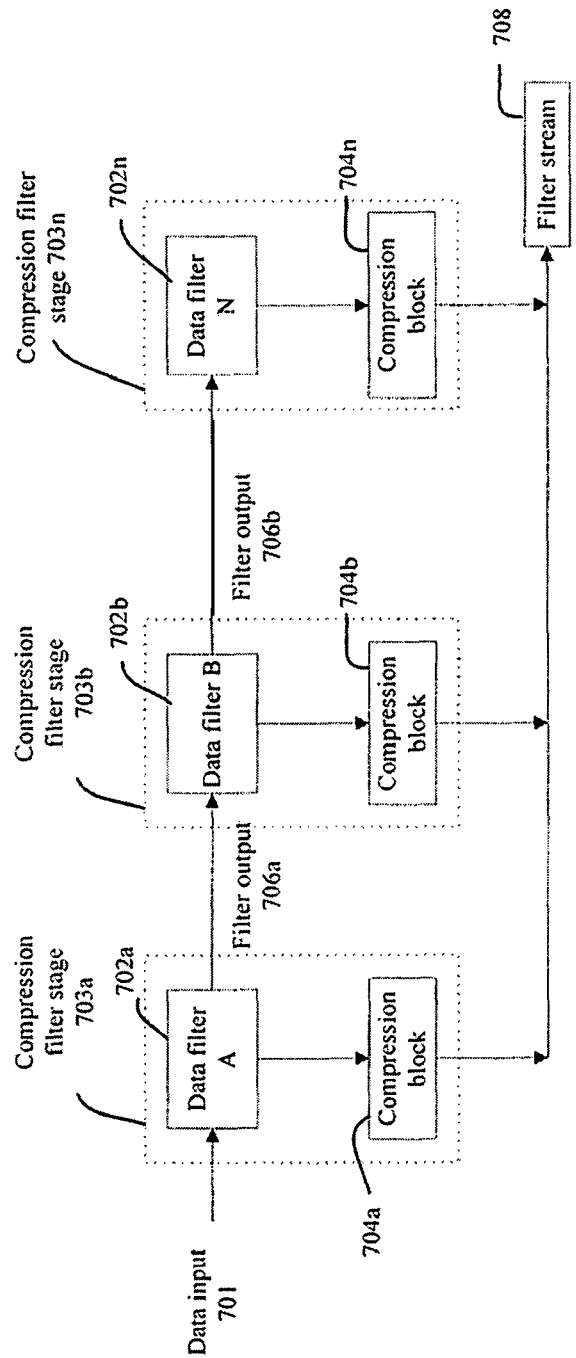
FIG. 7A is a diagrammatic representation of a method of compression.

These relations/redundancies are utilized in filtering and compressing the data using a series of compression filter stages in a filter cascade, as illustrated in FIG. 7A, in which the compression filter stages 703a-n are arranged, for example, with the output of one compression filter stage (e.g., 703a) providing the input to a subsequent compression filter stage (e.g., 703b). The filter cascade may be provided with an uncompressed data input 701. Each compression filter stage 703a-n applies a data filter 702a-n and a compression block 704a-n. Each data filter 702a-n in the series may. be designed to detect and filter out a different type of relationship/redundancy in the data. At each data filter 702a-n, a description of the relationship/redundancy may be sent as reconstruction data to be encoded by the compression block 704a-n using a standard compression algorithm and filtered from the data. The compression algorithm may be different for each compression filter stage 70a-n, and may have different parameters, depending on the data filter 702a-n and/or the input data. Commonly used compression algorithms apply arithmetic or range coding. Other suitable codes include Shannon-Fano-Elias code, Shannon code, Huffman code, Rice code, Golomb code, Tunstall code, and prediction by partial matching (PPM). The output of the compression block 704a-n is then sent to the filter stream 708. The filter stream 708 may include the output of each compression block 704a-n appended together. The filtered data of compression filter stage 703a forms the filter output 706a of that compression filter stage 703a and may be sent as the input of the next compression filter stage 703b. This may be repeated for each compression filter stage 703a-n in the series.

In some aspects, at the end of the filter cascade, the final compression filter stage 703n sends all of its data input to the compression block 703n, so that it has no filter output. Thus, at the end of the filter cascade, all the data may be compressed and represented in the filter stream 708. Typically, the last compression filter stage 703n in the filter cascade may assume its input data has uniform distribution and may compress all of its input data. The filter stream 708 may have an uncompressed information header at the start of the compressed data, which stores information (e.g., in the form of binary flags) indicating which compression filter stages 703a-n were applied during compression. In some aspects, this information header may be stored in the column description file described above.

In some aspects, during decompression, two passes through the filter cascade may be used. The first pass is from the beginning to the end, in the same order as during compression, to load the encoded descriptions of each compression filter stage 703a-n from the filter stream 708. The second pass is in the reverse order to reconstruct the original data from the filter stream 708. Each data filter 702a-n may have its own reconstruction and/or decompression algorithm. Alternatively, the information header may be designed to eliminate the need for the first pass of the two passes described above.

Figure 7B:
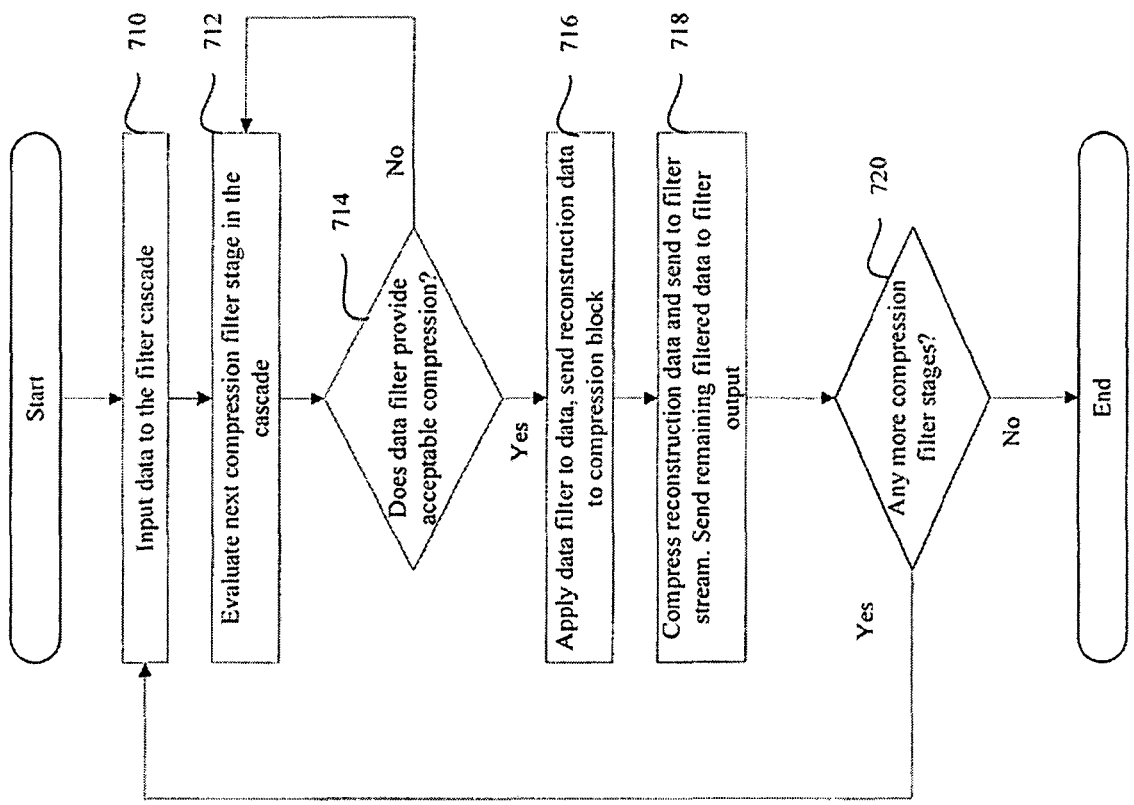
FIG. 7B is a flowchart illustrating operations of a method for compressing data.
Figure 7C:
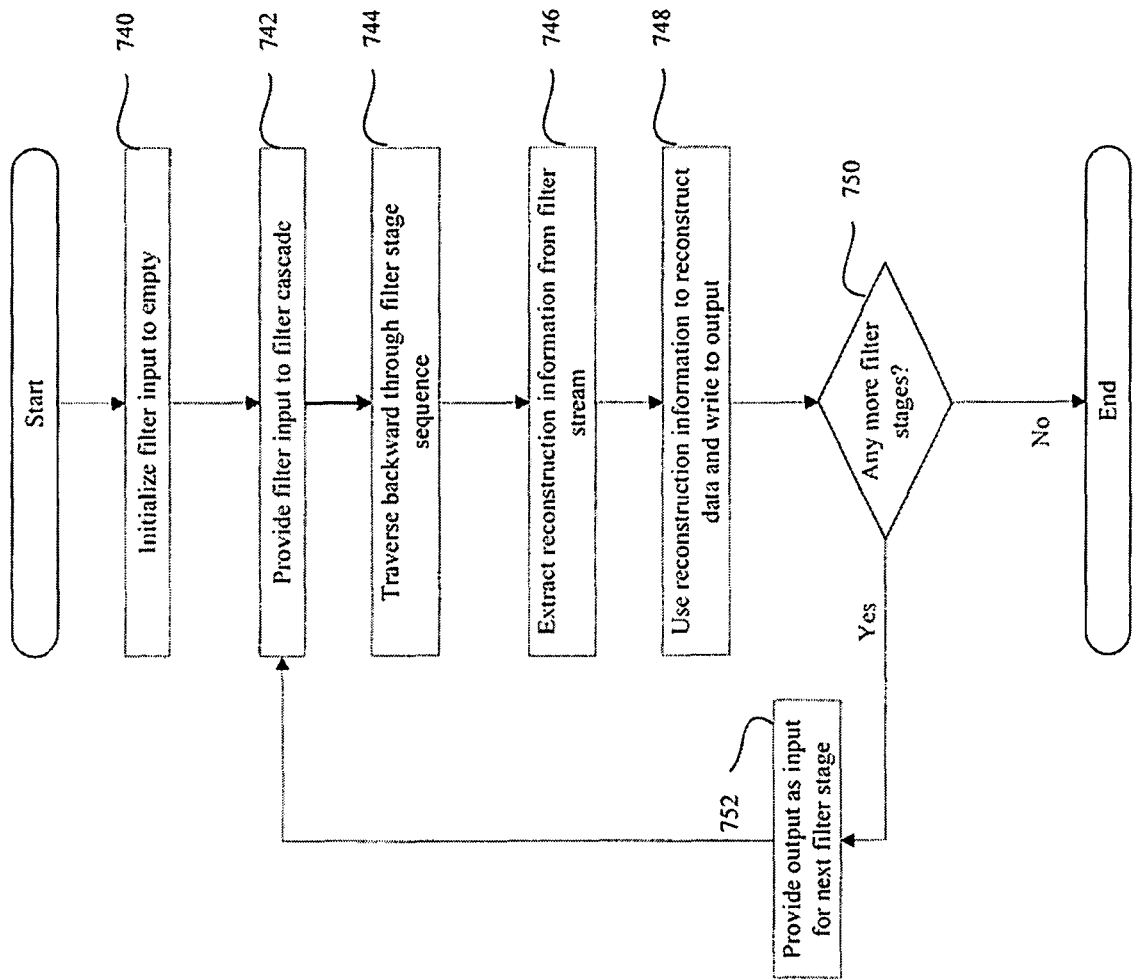
FIG. 7C is a flowchart illustrating operations of a method for decompressing data.

Reference is next made to FIG. 7B which illustrates processing of data by the filter cascade for compression, and FIG. 7C which illustrates processing of data by the filter cascade for decompression.

For compression (FIG. 7B), at step 710 the data may be introduced to the filter cascade.

The next compression filter stage in the cascade (i.e., the first compression filter stage in the case where the data is first introduced) may be considered for effectiveness at a step 712. In considering the compression filter stage, it may be evaluated to determine whether using the data filter of that filter stage improves the compression of the data. Each filter stage may have its own method of evaluation that evaluates or predicts the effectiveness of applying the data filter. This will be discussed in greater detail further below, with reference to some data filters. At a step 714 if the data filter is found to provide acceptable or improved compression, then the compression filter stage may be selected to be used and the process proceeds to a step 716. If not, the compression filter stage may be not selected for use and the process may return to step 712. What constitutes acceptable compression resulting in use of a particular filter stare may be fully configurable depending on the design criteria of a particular application.

At the step 716, the data filter is applied to the data. Reconstruction information, which may include the relationship/redundancies filtered out from the data, may be sent to the compression block. While the step 716 may be only arrived at if the data filter evaluated at the step 714 is considered to provide a certain level of compression, in some aspects steps 716-720 will always be executed for the last compression filter stage, as described above with reference to FIG. 7A.

At a step 718, the reconstruction information is compressed by the compression block of the filter stage, and the compressed reconstruction information may be provided to the filter stream. The remaining filtered data may be provided as the filter output. The reconstruction information may include information on how to reconstruct the input data from the filtered data.

At a step 720, if there is a subsequent compression filter stage to be evaluated or considered for use in the filter cascade, then the filter output may be sent as the input data for the next compression filter stage and the process returns to step 710. If there are no more filters, the process ends. At the end of the filter cascade, all the original data may be compressed in the filter stream and the filter output may be empty.

If there is a subsequent filter stage, but the filter output is already empty, the subsequent filter stage may be not used and the process may end. This may occur where the data is redundant enough that removal of certain redundancies filters all the data for inclusion in the filter stream, for example, in data where all elements have a high frequency of occurrence. Indication that the subsequent filter stage was not used may be added to the filter stream or to the header data, so that the data can be properly reconstructed during decompression.

FIG. 7C illustrates an operation for decompression of compressed data. At a step 740, the filter input may be initialized to empty.

Next, at a step 742, the filter input may be provided to the filter cascade. At the start of the decompression process, the filter input may be typically empty. In some aspects, the filter input may be initialized to contain some data, for example where some of the data was already decompressed or was not compressed. Next, at a step 744, the filter cascade is applied in the reverse order to the order described above for compression. In some aspects, the order in which compression took place may be pre-set and known. If the compression order is not known, this information may be provided in an uncompressed header block associated with the compressed data. The compression order may also be provided in an information header (e.g. a column description file) associated with the compressed data file.

In some aspects, there may be a preliminary step (not shown) in which the compressed data may be processed by the filter cascade in the same order as during compression. This preliminary step allows extraction of data reconstruction information, such as identification of which filter stages were applied, for each filter stage from the filter stream. This preliminary step may also partition the filter stream into blocks of compressed data generated by separate compression filter stages.

Next, at a step 746, the filter stream may be read by the filter stage and the reconstruction information may be extracted. The reconstruction information may be decompressed by applying a corresponding decoding algorithm according to the compression algorithm used. The reconstruction information may be relevant only to the particular filter stage being considered, or it may contain information for other filter stages in the cascade, in which case only the relevant information may be considered.

Next, at a step 748, the reconstruction information is used to reconstruct the data from the filter stream. The method of reconstruction may be unique to each filter stage. If the filter stream has passed through the entire filter cascade in reverse as appropriate, the data may now be fully reconstructed. Otherwise, the data may be only partially reconstructed. The fully or partially reconstructed data may be written to the output of the filter cascade.

Next, at a step 750, if there is another filter stage in the reverse cascade, the process proceeds to a step 752 where the output (e.g., the partially reconstructed data) of the previous filter stave may be provided as the filter input for the next filter stage. The process then returns to the step 742 to move to the next filter stage. If there are no more filter stages in the reverse cascade, the output may now consist of the fully reconstructed data and the process ends. In the case where the compressed data is fully recoverable, the output consists of fully reconstructed data that may be identical to the original uncompressed data.

The filter cascade may be flexible in that it may separate different types of redundancies which simplifies filter design and implementation, may allow easy switching on/off of some of the filter stages, and may allow the same type of filter stage to be used several times in the series. In some aspects, the order in which the filter stages are applied may be varied, and may be dynamically varied. Some examples of the types of the data filters that may be used are described below. These examples are for the purpose of illustration only, and are not intended to be limiting. Some data filters may be used with numeric data only, alphanumeric data only, or both:

1. Min: subtracts the minimum of all data elements from each element of the data, thus reducing the range of the data; the value of the minimum is compressed and sent to the filter stream. To reconstruct the data, the minimum value is decompressed and added onto each element.

In evaluating whether to use this filter, typically the Min filter may be applied if it reduces the range of the data elements. In general, this means that if the data elements have a non-zero, preferably positive minimum value, the Min filter may be applied.

2. GCD: determines the Greatest Common Divisor (GCD) of all data elements, and divides each element by the GCD; the value of the GCD is compressed and sent to the filter stream. To reconstruct the data, each element is multiplied by the GCD.

Typically, the GCD filter may be applied if a GCD exists. In general, this means that if the data elements have a GCD greater than 1, the GCD filter may be applied.

3. Diff: calculates a differenced sequence consisting of differences between pairs of subsequent elements (i.e., between element n and element n+1), and sends the differenced sequence to the next stage of compression. In some aspects, the first element in the sequence is unchanged. Values of differences may be taken modulo (max_value+1), where max_value is the maximum value of all data elements. The result is that any difference that is less than zero will have max_value added to it, so they fall into the same range as the original values, while data reconstruction is still possible. The max_value is compressed and sent to the filter stream.

Reconstruction of data filtered through the Diff filter may be done as follows: the first element is unchanged, so it is taken as-is; the second element is reconstructed by adding the second element of the difference sequence to the first element; the third element is reconstructed by adding the third element of the difference sequence to the reconstructed second element, and so on through the entire difference sequence. If modulo was applied to the difference sequence, this also should be reversed in order to recover the data exactly. To do this, the max_value is decompressed from the filter stream. Then any reconstructed element that has a value greater than max_value will have max_value subtracted from that element.

Determination of whether the Diff filter may be applied may be typically based on calculations of the entropy of the data with and without applying the filter. The differences of the data are calculated and the entropy of the differenced data is compared to the entropy of the original data. If the entropy of the differenced data is smaller, then the Diff filter may be applied. In order to speed up calculations, in some aspects, this determination may be based only on a sample of the data. For example, only 5% of the data may be differenced and used for entropy comparison. In some aspects, the entropy may be calculated using only certain bits of the data, for example the top 8 and bottom 8 bits separately. When only 8 bits are considered, only 256 different values may occur, which results in entropy calculations that are easier and more reliable. If all values in the data are shorter than 16 bits, the number of bottom bits considered may be appropriately decreased. If all values in the data are shorter than 8 bits, only the 8 top bits may be used to calculate entropy.

4. PartDict: builds a partial dictionary of values occurring in the sequence and uses it to compress the data with a standard encoding algorithm, such as range coding (RC). The frequency of each value in the dictionary may be also stored to calculate probabilities for compression. The dictionary is referred to as partial because only frequent values are stored, meaning values having a number of occurrences above a certain constant threshold, which may be pre-determined. If a rare or non-frequent value occurs in the sequence during encoding, a special escape symbol is encoded and the rare value is left in the sequence, forming the filter output for input to the next filter in the filter cascade. Frequent values are removed from the data after encoding. Before encoding of the data, the dictionary is compressed sent to the filter stream. The encoded sequence of frequent values is also sent to the filter stream.

Typically, determination of whether to apply the PartDict filter may be based on a comparison of the compressed data size after applying both the PartDict filter and the Uniform filter (discussed below) and the compressed data size after applying the Uniform filter alone. It may be possible to predict the compressed data sizes for both cases without actually carrying out the compression using mathematical techniques common in information theory, such as by estimating the average code length (i.e., the size of each compressed element) based on the entropy of the corresponding probability distributions of symbols. If the predicted compressed data size after applying both the PartDict and the Uniform filters is smaller than after applying the Uniform filter alone, then the PartDict filter may be applied.

Figure 8:
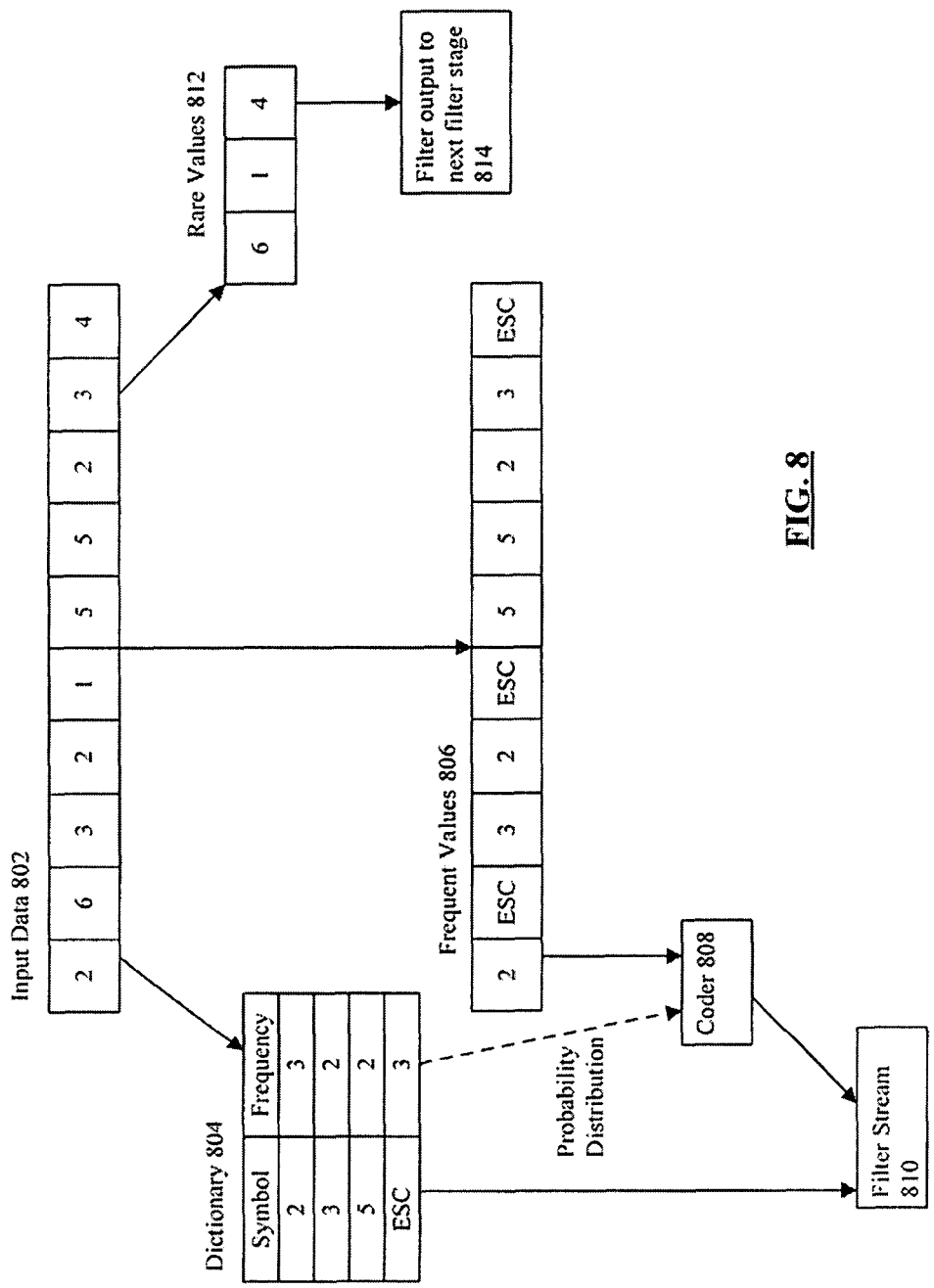
FIG. 8 is a schematic diagram illustrating operations of a method for compressing data using a PartDict data filter.

An example of compression using PartDict is shown in FIG. 8. Input data 802 contains elements with certain frequencies of occurrence. In this example, an element is considered to have a high frequency of occurrence if it occurs at least twice. Thus, frequent values are 2, 3 and 5; rare values are 1, 4 and 6. The frequent values are placed in a dictionary 804 with their associated frequencies of occurrence. Rare values 812 are assigned the symbol ESC. The frequent values are removed from the input data 802 and placed in a frequent value sequence 806 along with ESC where the rare values 812 should occur. The probability distribution stored in the dictionary 804 is used to encode the frequent value sequence 806 using a standard coder 808, applying an encoding algorithm, such as RC or arithmetic coding (AC). The dictionary 804 and the coded frequent value sequence are included in the filter stream 810. The rare values 812 form the filter output 814.

Figure 9:
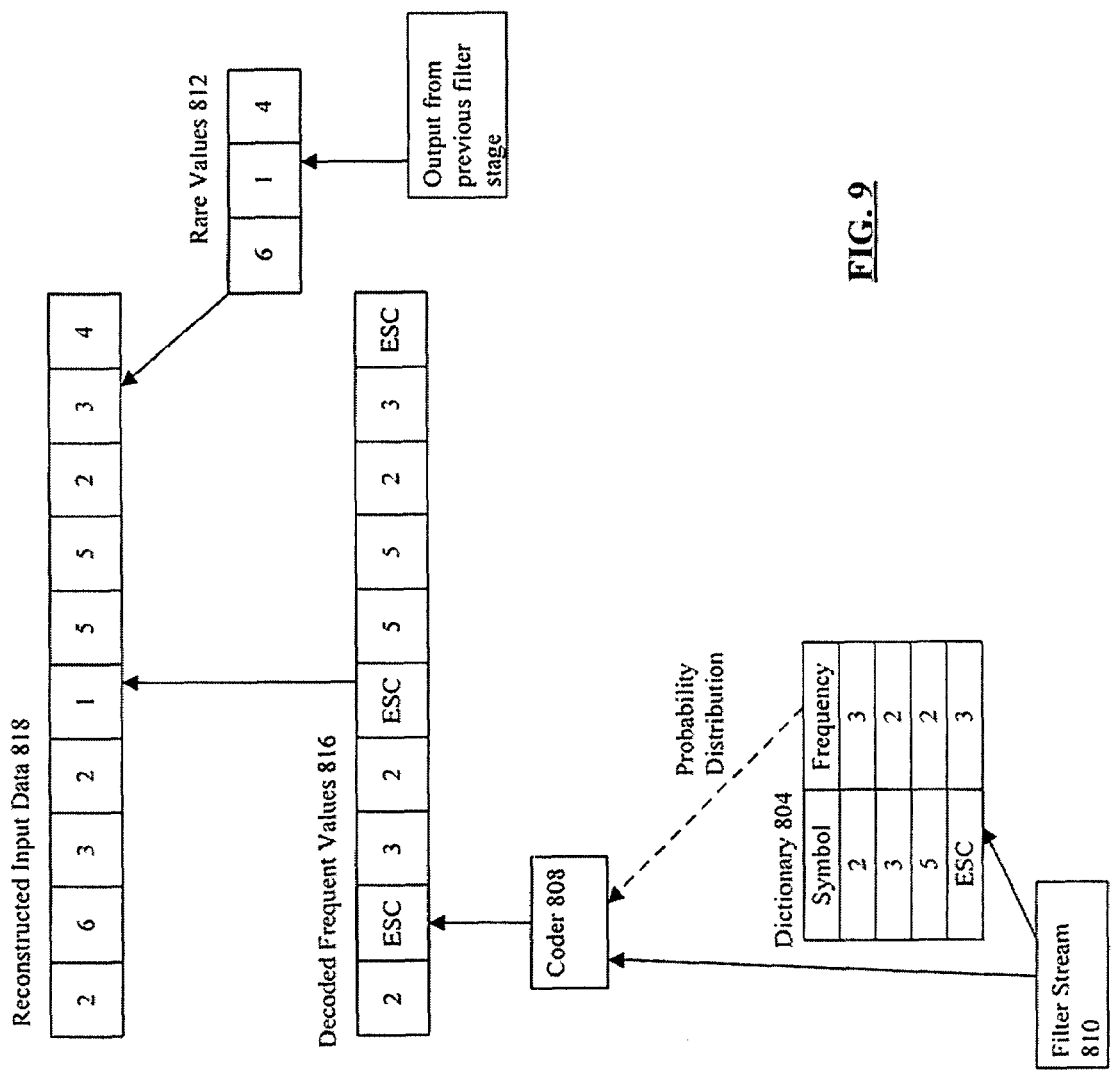
FIG. 9 is a schematic diagram illustrating operations of a method for decompressing data that was compressed using the PartDict data filter of FIG. 8.

FIG. 9 shows the decompression of this example. The dictionary is decompressed from the filter stream 810. The probability distribution from the dictionary 804 is used with the coder 808 to decode and recover the decoded frequent value sequence 816. The rare values 812 are provided from the output of the previous filter in the decompression process. The ESC symbols are replaced with the rare values 812 to recover the reconstructed input data 818. This example is for the purpose of illustration only and is not intended to be limiting.

5. TopBitDict: builds a full dictionary of a group of the top bits of all elements of the data. The dictionary also stores frequencies of occurrence of each group of top bits. The dictionary is compressed and sent to the filter stream. The top bits of each element of the data are compressed by encoding with a standard compression algorithm such as RC, using the probability distribution represented by the dictionary. The encoded sequence of top bits is sent to the filter stream. The lower bits of the elements are left in the sequence, forming the filter output, and passed to the next stage. The number of top bits used for encoding may be chosen so as to minimize the predicted length of the compressed data. Decompression is similar to that of PartDict. Evaluation of whether to apply the TopBitDict filter may be done using predicted compressed data size, similar to the technique for the PartDict filter.

6. LowBitDict: similar to TopBitDict, for the lowest bits of each element.

7. Outliers: considers the values of the elements rather than their frequencies of occurrence. First, outliers are detected in the data sequence by finding a small number of elements which have much larger or much smaller values than certain statistics (which may be dependent on the data type) calculated for the rest of the elements. The threshold for determining what is considered an outlier may be pre-determined or it may be dynamically selected, depending on the data. In some cases, the number of values that may be considered outliers may be pre-determined. Then, the outliers are removed from the data sequence. The positions and values of the outliers are compressed and sent to the filter stream. The data sequence with the outliers removed forms the filter output. Reconstruction of the data may be done by decompressing the values of the outliers and their position information and merging this information with the sequence of non-outliers.

Typically, determination of whether to apply the Outliers filter may be done using predicted compressed data size, similar to the technique for the PartDict filter. In some aspects, entropy calculations may be performed to predict or to evaluate the optimum number of values that maybe considered outliers.

8. Uniform: assumes uniform distribution of the data in the range of [0, max_value] and compresses all elements of the data by encoding with a standard encoding algorithm, such as RC. The filter output may be typically empty, and this filter typically may be the last filter in the filter cascade for compression.

In addition to the data filters described above, there may also be a mechanism for detection of repetitions of the same record. Before compression of the next record, it may be checked whether it is the same as the previous record. If so, it may be given a certain encoding, e.g., bit '1'. Otherwise, bit '0' may be encoded. Use of this mechanism may improve the compression ratio and speed by 8%.

Compression filter stages containing the above-described data filters may be applied according to the ordering listed above, or the ordering may be dynamically rearranged and some of the filter stages may be repeated based on the intermediate results of the output from preceding filter stages. Before applying a filter stage a check may be optionally preformed to determine if the filter stage should be applied. This check uses the intermediate results to determine whether for efficiency purposes the filter stage should be applied, (e.g., if the associated relationship/redundancy considered by the filter stage exists and if the application of the filter would result in compression gains sufficient to warrant the application of the filter, given the associated performance costs of compression and decompression).

Compression of NULL Masks and Binary Columns

The occurrences of 0 and 1 in the data column are counted to calculate probabilities of 0 and 1 which are then passed to a standard compression algorithm, such as Arithmetic Coding (AC), which can yield a compression ratio of 2.6 to 1 on average. In some data packs there may be correlations between neighbouring bits. To utilize this fact, the sequence may be differenced. Entropy, a well-known measure applied to probabilities, may be calculated for the differenced sequence. If the entropy of the differenced sequence is lower than the entropy of the original sequence, the differenced sequence may be encoded instead of the original sequence. This is similar to the Diff filter. Then, during decoding, the reverse operation may be performed. This modification may give an average compression ratio of 3.5 to 1.

String Compression

Strings may be also compressed using a compression algorithm selected for the string data type. As in the case of numeric and binary data, the sequence of string values taken from a given data pack (e.g., for a database column keeping alphanumeric data) is first cleaned of NULLs and is then put through the filter cascade, as shown in FIG. 7A. The output from each applied filter stage may take the form of a sequence of string values. The general scheme of the filter cascade while compressing and decompressing data may remain the same as before.

The list of available filter stages for sequences of string values remains open, as in the cases of other data types. An example of a filter which is applicable to string values is PartDict. The work of PartDict, both during compression and decompression of a sequence of string values may be similar to the case of numeric values. In some aspects, strings may be compressed using an algorithm based on Prediction by Partial Matching (PPM), which is commonly used for text compression. PPM is an adaptive technique. PPM attempts to predict the next symbol in a string on the basis of the preceding symbols (i.e., the context). PPM is discussed in detail in, for example, "Data Compression" by David Salomon, 3rd edition, Springer-Verlag, 2004, Chapter 2.18; and in "Introduction to Data Compression" by Khalid Sayood, 3rd edition, Morgan-Kaufmann, 2005, Chapter 6.3, which are incorporated herein by reference in their entirety. PPM compresses strings using a probability distribution for each symbol in a string based on the preceding symbols. This probability distribution may be updated continuously as more symbols are encountered in the string. PPM may be used to compress strings using a dictionary containing the probability distribution of each symbol.

Some implementations of PPM attempt to predict the next symbol using all preceding symbols as the context, while other implementations use a fixed length context. If this prediction is not possible, the context may be reduced by removing a preceding symbol from the context. This may be repeated until a prediction can be made, or until there are no more symbols in the context. When no symbols remain in the context, a fixed prediction may be made, which may be based on an assumption of uniform distribution of all possible symbols. When a never-before seen symbol is encountered, an escape symbol may be used and a predetermined probability may be assigned to the new symbol.

Simply using PPM alone may be cumbersome because of the large amount of memory required to store the context, especially in the case where all preceding symbols are used as the context. In such an implementation, searching for a given context in an encoded part of the string would give $O(n^2)$ complexity. Instead, a trie or suffix tree data structure may be used to represent the string. These data structures store the symbols in branching nodes in tree form. These data structures permit faster context searching through the use of pointers back to earlier nodes, such pointers being known as suffix links. Use of a trie or a suffix tree for implementation of PPM is known in the art, and variations are possible. The probability distribution for use in PPM may also be stored in the data structure, for example as weights on the nodes of a tree. This probability distribution may be continuously updated as the symbols are processed.

PPM has been used to compress a large portion of text, such as an entire text file. To use PPM for compression of a sequence of short strings, there are several approaches. PPM may be used to compress each string separately, however this method may not be able to exploit any similarity between strings. Another method may be to concatenate the strings, perhaps separated by a special symbol, and compress the result as a single string; however this method may not be able to exploit information about string boundaries to improve compression. Another method may be to modify PPM to hold a sequence of strings, instead of a single string. In this modification, the data structure may be modified to represent suffixes of all processed strings, and at the beginning of compression of the next string, the context may be reset to empty (e.g., the root node of the tree in the case of a tree data structure).

In some aspects, a Compact Directed Acyclic Word Graph (CDAWG) data structure may be used to implement PPM. A CDAWG is a data structure for storing alphanumeric data in a way that permits fast word searching with decreased space requirements. CDAWGs have been used for alphanumeric data storage. Aside from use in text searches, CDAWGs have also been used in analysis of DNA sequences in bioinformatics.

Using a CDAWG as the data structure may provide the advantages that the data is stored in a compact form, and that the space requirements are minimized. The data in a CDAWG may be stored in a compact form as in a suffix tree, where the edges (i.e., the path between adjacent nodes) of the tree may be labelled by more than one symbol, so that moving between adjacent nodes may give more than one symbol. The data tree in a CDAWG may be minimized as in a Directed Acyclic Word Graph (DAWG), where equivalent nodes of the tree are merged into a single node, thus avoiding redundant nodes.

Certain implementations of CDAWG may require input of all the symbols before the CDAWG is created. This may be time-consuming and impractical where there is a large amount of data. In other implementations, the CDAWG may be created on-line (e.g., in linear time, as the data is being read) using the algorithm disclosed in Inenaga et al., "On-line construction of compact directed acyclic word graphs", Discrete Applied Mathematics 146(2):156-179, 2005, which is incorporated herein by reference in its entirety. By creating the CDAWG on-line, the alphanumeric data may be read through one symbol at a time, and the CDAWG may be created with suffix links, so that each subsequent symbol can be efficiently added to the CDAWG.

The probability distribution of each symbol may be also calculated and updated on-line as the data is being read, thus creating a CDAWG that has the additional feature of weights for each node and/or edge corresponding to the probability or frequency of that node and/or edge. As each symbol is read, the structure of the CDAWG may be modified as needed, and the probability distribution of that symbol may be updated. When a never-before seen symbol is encountered, an escape symbol may be used and a predetermined probability may be assigned to the new symbol. In some aspects, when a new symbol is processed, the CDAWG may be traversed to see if a node for the symbol. already exists. As the CDAWG is traversed, each edge and/or node that is passed may have its weight or probability distribution updated (e.g., by increasing the weight). If the node that is needed does not exist, a new node and an associated escape symbol may be created in the CDAWG, thus changing the structure of the CDAWG. In this way, a CDAWG containing probability distributions for each symbol is created on-line. The probability distributions can then be used as a dictionary for compression using PPM.

In some aspects, the dictionary created by the data structure (e.g., suffix tree or CDAWG) may be recalculated and reduced from time to time, to keep its size down where storage space is limited. This may be using a process similar to the PartDict filter, where strings or symbols with lower frequencies may be pruned from the data structure.

PPM using CDAWG may offer an improvement over PPM using suffix trees especially for compression of a sequence of short strings, as commonly found in databases. For such data, a CDAWG data structure may contain over 10 times fewer nodes and 5 times fewer edges, the memory required may be 7-10 times less, and the compression speed may be several times faster than if using a suffix tree.

In some aspects, more than one symbol may be encoded in one step of the compression algorithm. This is possible because in CDAWG and in suffix trees, an edge may be labelled by several symbols rather than a single symbol. In order to account for the situation where the string to be encoded matches only the beginning part of an edge label, the number of symbols matching the edge label may also be encoded in addition to the choice of the edge. This number may have highly non-uniform and bi-modal distribution, which can be exploited to improve the compression ratio.

Other possible implementation details include partial updates of data frequencies, unbounded context length (e.g., where all preceding symbols are used as the context), constant frequency for the escape symbol (e.g., the escape symbol may be given a probability assuming uniform distribution), implementation of exclusions (e.g., correcting the probability distribution of a symbol in a certain context to exclude occurrences that are not possible), and use of a special start node in the data tree. Such implementations and techniques are not discussed here in detail, but are common in the art. Certain combinations of these details may provide a better compression speed and/or ratio.

In some aspects, the data structure (e.g., suffix tree or CDAWG) may be created when the data is first compressed, and may be discarded after compression. The data structure may be recreated every time the data is decompressed.

Query Optimization

Query optimization refers to the optimal choice of functions and ordering of functions to provide query results in the shortest amount of time. Query optimization involves simulating potential query execution plans to determine the optimal query execution plan to answer a query. Query optimization does not actually access data, rather it uses information about the number of data packs 221 that will need to be accessed to answer the query using DPNs 222 and KNs 224. Because the data itself is not accessed, the query plan execution simulations may be substantially faster than the time required to actually execute the plan. Thus, query optimization in the RDBMS 200 is closely related to query execution. Query optimization may simulate not only the overall candidate execution plans, but also the respective parts to locate and avoid bottle necks that may occur in operations required to answer the query, for example delays that may occur as result of a non-optimal ordering of joining operations.

Query optimization may be implemented by the Query Optimizer 208 (FIG. 1), which may be a functional program module. The Query Optimizer 208 may implement a heuristic program which begins with a candidate plan for the query, execution plan, simulates the result, then uses the simulated results to determine the amount of data that needs to be accessed or execution time required by the candidate plan for the query execution plan. The Query Optimizer 208 may then attempt another candidate plan to determine if performance may be improved.

Query optimization may use techniques such as rough set analysis (RSA) techniques to determine which data packs 221 need to be accessed by analyzing the information of the DPNs 222 of each data pack 221 and the KNs 224 associated with each data pack 221. Query optimization may use the concept of positive region, negative region, and boundary region for dealing with data packs that are fully relevant, fully irrelevant, and partially relevant respectively. Data packs 221 determined to be in the positive region (e.g., fully relevant) sometimes need decompression if the information cannot be obtained directed from the DPN 222 or KN 224, although typically not. Negative region (e.g., fully irrelevant) data packs 221 do not need decompression. Boundary region (e.g., partially relevant) data packs 221 usually need decompression, however there may be some special cases where decompression is not required.

Query optimization operations generally may include the following steps:

1. Choose a candidate plan for the query execution plan;
2. Simulate the data usage of the candidate plan at the level of data packs 221 using only estimates from the KNs 224 and without accessing (i.e., decompressing) the underlying data;
3. Determining the potential usefulness of structures currently loaded in memory such as decompressed data packs 221, DPNs 222, and KNs 224;
4. Determining the data amount of data packs 221 that need to be accessed (i.e., decoded or decompressed and loaded into memory) and/or an estimate of the amount of time to execute the query; and
5. Repeating steps 1 to 4 for the next execution plan candidates until the shortest execution time may be determined or a satisfactory execution time may be determined. For examples a satisfactory execution time threshold can be fixed based on historical or logged information about execution times of queries of comparable complexity or a timeout (e.g., this could occur after a fixed number of heuristic steps, or even before reaching it if there is no improvement in the heuristic search). Alternatively, the minimum required memory can be optimized (see step 4 above).

Each step in the above operation may be performed taking into account the result of the previous steps. If there is a series or conjunction of conditions calculated in series, then records and data packs 221 which are excluded earlier need not participate in the subsequent calculations.

Query Optimazation Example

The following example is for the purpose of illustration only, and is not intended to be limiting. A partial example of a query optimization procedure will now be described. First, assume that the query to be resolved involves a joining of three columns, A, B and C where A>7, B<6, and C="YES". During query optimization, the first candidate execution partial plan may first join A and B and determine that this requires 1,000 data packs 221 to be accessed to answer the subquery of A>7 and B<6. The Query Optimizer 208 may then generate a second candidate execution partial plan where A and C are joined and determine that the subquery of A>7 and C="YES" requires 100 data packs 221 to be accessed. The Query Optimizer 208 may then generate a third candidate execution partial plan where B and C are joined and determine that the subquery of B<6 and C="YES" requires 10,000 data packs 221 to be accessed. In this case, the Query Optimizer 208 would choose to join the second candidate execution plan where A and B are joined, which minimizes the number of data packs 221 to be accessed, and then join the result with C so as to minimize the number of data packs 221 that need to be accessed to answer the query.

Hence, the query execution and optimization steps may interact within each other unlike in conventional RDBMSs. The query simulation performed during query optimization partially executes candidate execution plans and returns "immediate results" to the Query Optimizer 208 for further analysis before continuing the execution of the query, and provides the possibility of further execution plan modifications if subsequent candidate plans improve performance. Thus, unlike conventional query optimization, the order in which subqueries are executed may be changed based on the intermediate results. Conventional query optimization and execution approaches typically use classical indices, do not allow optimization during execution, and require data to be accessed in the same order as in the query execution plan created by the query optimizer.

KN information may be used for optimization and specifying the query execution plan, for example, using pack-to-pack joins to determine which data packs need to be joined during execution, although KN information may also be used before at the optimization level. During execution itself, after the optimal plan is determined, DPNs 222 and data packs 221 may be utilized to answer the query. For example, the sums from particular data packs 221 may be obtained from DPNs 222 if the query requires the sum over some column.

Data Structure

Figure 10:
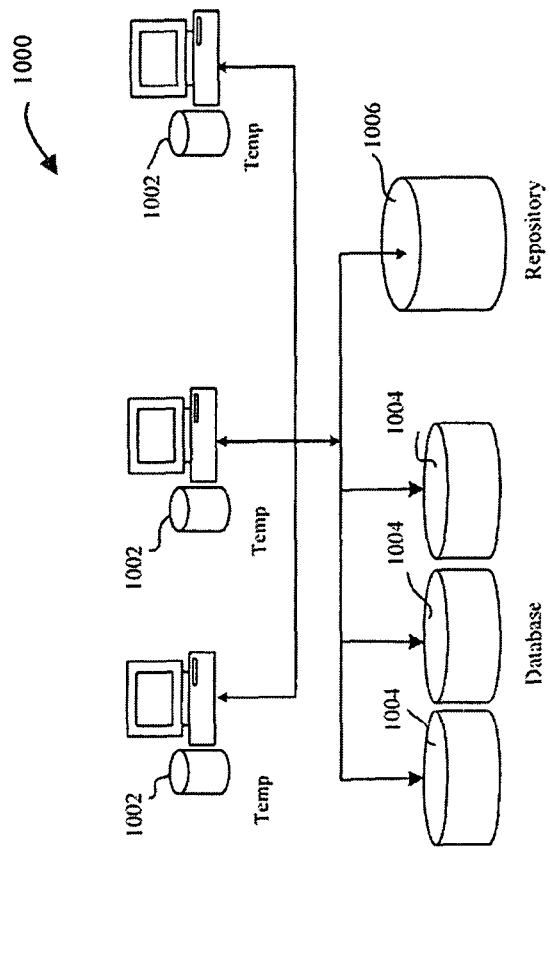
FIG. 10 is a schematic representation of data within the RDBMS of FIG. 1.

FIG. 10 illustrates the organization of the data within the RDBMS 200. In system 1000, data storage may be separated into three primary components: a database 1004 which may be either distributed or partitioned as shown or undistributed, a local cache 1002 database engine invocation (e.g., a temporary cache folder on the local HDD), and a central repository 1006. All of these data stores 1002, 1004, and 1006 may be located on different devices, however the database 1004 and central repository 1006 are sometimes stored together. Every KN 224 may be represented by one file in the central repository 1006.

In some aspects, the type and parameters of each KN 224 may be encoded in its file name. In some aspects, each KN 224 may have a file name with the format:

XXXXXX.a.b.c.d.e.f.g.h.rsi where XXXXXX is a 6-character type identifier; a, b, c, d, e, f, g, h are numbers which identify objects and optionally may be type-dependent; and .rsi identifies the file as a KN 224. The repository 1006 may contain a definition file that describes its contents, and the definition file may have a file name of the format: rsi_dir.rsd.

The central repository 1006 may use periodic maintenance to check for the following possible inconsistencies:

i.) whether there is a .rsi file not described in a repository definition file. If so, the .rsi file should be removed;

ii.) whether the definition file contains entries which do not match any existing file. If so, these entries should be removed or a matching file should be scheduled for creation;

iii.) whether the KNs 224 are locked (e.g., marked as "working" as described below), but no client application 202 is using these KNs 224. If so, these KNs 224 should be unlocked.

The central repository 1006 may be accessible by multiple client applications 202 (FIG. 1) (e.g., multiple users) simultaneously, so the central repository 1006 may allow parallel access. To accommodate multiple client applications 202, a file locking mechanism may be used. KNs 224 may be typically small and may be loaded entirely to memory in which case access to them may be exclusive, for example only one process may read or write a particular KN 224 at one time. A method for resolving sharing conflicts may be as follows:

i.) when writing to a KN 224 is in progress, then if a first process tries to open a KN 224 that is being written by a second process, access of the first process to the KN 224 may be denied;

ii.) when a KN 224 increases in scope so old data is still valid, then if the information stored by the Knowledge Grid Manager 220 is obsolete (e.g., because the data pack(s) on which the KN 224 is based has been increased in scope), the KN 224 may be loaded into memory and the KN 224 may be updated after being loaded;

iii.) when a KN 224 decreases in scope so old data may not be valid, then if the information stored by the Knowledge Grid Manager 220 is obsolete (e.g., because the data pack 221 on which the KN 224 is based has been decreased in scope), the KN 224 may be not loaded into memory and the operations may proceed without the KN 224 by proceeding to access the DPN 222 or data in the respective data pack 221;

iv.) when a new KN 224 is created which supplements but does not replace an old KN 224, then if the information stored by the Knowledge Grid Manager 220 is obsolete (e.g., because there is a new KN 224), the older KN 224 may be loaded into memory.

Unlike conventional database indices which cannot be accessed once the underlying data has changed unless the database indices have themselves been updated (typically, data and database indices must be updated together, absent which the data cannot be accessed), data packs 221 and DPNs 222 in the RDBMS 200 may be updated independently of any associated KNs 224. This allows updated data in data packs 221 to be accessed almost immediately whereas associated KNs 224 may not be available depending on whether such objects have been updated. This may be advantageous in that some KNs 224 may be time consuming to update. Therefore, KNs 224 which are quicker to update may be updated shortly after the underlying data pack 221, while more time consuming KNs 224 may be updated at a convenient time such as when the RDBMS 200 is less active.

When a new Knowledge Grid Manager 220 task is scheduled, it may be written in a repository definition file. To write to the definition file, the file may be reopened in exclusive mode, alter which it may be read. If the file does not yet contain the desired task, the task may be added and the file may be written to disk and then unlocked. A similar procedure may be used when an Knowledge Grid Manager 220 decides to execute a scheduled task: first, the definition file may be opened exclusively to read the task definition assuming it is still available, then the task may be marked as "working", the file may be written back to disk and unlocked. Meanwhile, the KN object file may be locked and its recalculation may start. After a successful object update, the repository definition file may again be locked and updated as the task is removed from the schedule.

Tiered Data Warehouse Architecture

Figure 11:
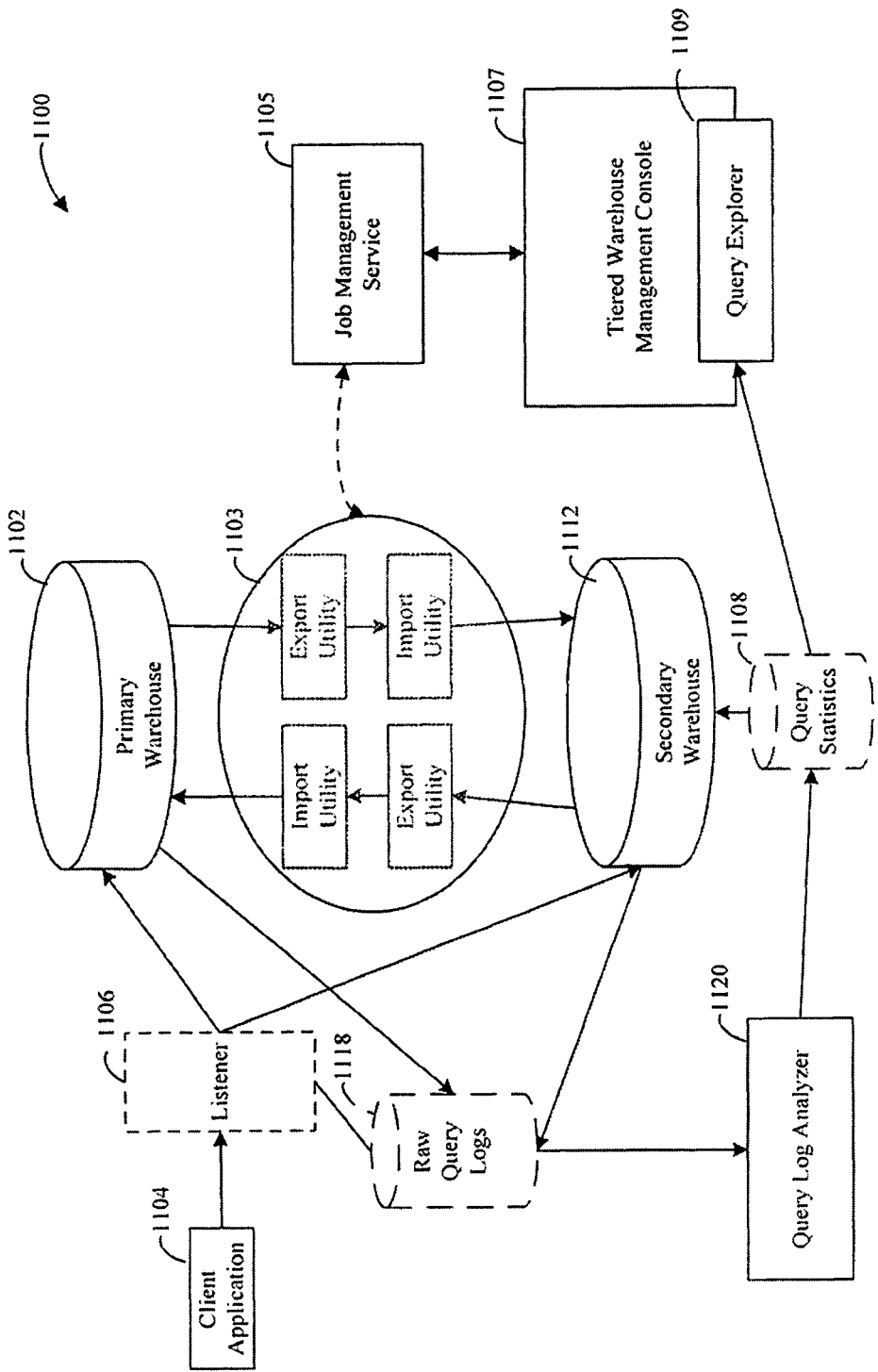
FIG. 11 is a schematic representation of a tiered data warehouse.

FIG. 11 illustrates a tiered data warehouse system 1100. The system 1100 may include a primary warehouse 1102 coupled to an archival secondary warehouse 1112 via a Tiered Warehouse Management Console 1107. Between the primary warehouse 1102 and the secondary warehouse 1112 are the import/export modules, collectively 1103, that facilitate data transfer between the primary warehouse 1102 and the secondary warehouse 1112. The primary warehouse 1102 may include a RDBMS 200 coupled to a database including one or more base tables each including one or more data records. The RDBMS 200 may include a conventional RDBMS, for example such as that provided by MySQL®, Teradata™, Oracle®, etc.

One or more users may access the primary warehouse 1102 via respective client applications 1104 implemented on user terminals (not shown). A SQL-based interface may be provided by the client application 1104 to access the primary warehouse 1102 using standard SQL query tools. The system 1100 may optionally include one or more of a listener 1106 which monitors and stores queries (e.g., SELECT statements) or alternatively queries are extracted from the primary warehouse 1102 and/or secondary warehouse 1112 log files. The resulting, query log 1118 may be provided to the Query Log Analyzer 1120.

Users accessing the secondary warehouse 1112 may use the same client application 1104. A SQL-based interface may be provided by the client application 1104 to access the secondary warehouse 1112 using standard SQL query tools. Unlike the primary warehouse 1102, the secondary warehouse 1112 may include an RDBMS 200 coupled to a database including one or more data packs 221 each associated with basic analytical information in the form of DPNs 222 and having associated therewith advanced analytical information in the form of KNs 224.

The Query Log Analyzer 1120 may be a functional program that analyzes query information collected in the raw query logs 1118 to determine the usage of data by users over a given time period within the primary warehouse 1102 and secondary warehouse 1112. The Query Log Analyzer 1120 analyzes the frequency of data usage or access within the primary warehouse 1102 and secondary warehouse 1112. Alternatively, specific query statistics need not be recorded. Instead of maintaining specific statistics, an approximation of the queries on specified data (e.g., data ranges based on time or some other factor) using a satisfactory statistical sampling of queries may yield faster results and still provide the desired information on user queries. The Query Log Analyzer 1120 may also identify the user who executed the query, the tables and columns and the manner in which the columns where referenced within the query (e.g., part of the result set, used in JOIN criteria or used for filtering or sorting results).

The Query Explorer 1109 allows a user to examine the results of the Query Log Analyzer 1120 that are stored in the query usage statistics 1108. Depending on the frequency of data usage and pre-determined performance criteria, the Query Explorer Module 1109 may identify candidate data in the primary warehouse 1102 that may be moved to the secondary warehouse 1112 to improve the performance of the system 1100. The Tiered Warehouse Management Console 1107 may manage the tiered environment, may identify candidate data via the Query Explorer 1109 in the primary warehouse 1102 that may be moved to the secondary warehouse 1112, and may manage the data movement (e.g., data migration) process, using the service of the Job Management Service 1105, which coordinates the activities of standard import and export utilities 1103 provided by the primary and secondary warehouse 1102 and 1112. The Job Management Service 1103 uses encoding operations similar to the operations 300 described above when exporting data from the primary warehouse 1102 to the secondary warehouse 1112. Base tables from the primary warehouse 1102 are encoded and stored in data packs 221 with DPNs 222 and KNs 224 in the secondary warehouse 1112.

The performance criteria of the Tiered Warehouse Management Console 1107 may specify an access frequency (e.g., in terms of % usage in a given time interval), relative access rate of selected data, or other pre-defined conditions which identify data in the primary warehouse 1102 as being suitable for transfer and archiving in the secondary warehouse 1112. The user may be allowed to specify parameters, for example the user may specify that only 10% of data should be left in the primary warehouse 1102. In this case, the Tiered Warehouse Management Console 1107 may search for the 10% or some other suitable percentage which is most frequently used in queries to keep in the primary warehouse 1102 and migrate the remainder to the secondary warehouse 1112, and may express the most active 10% using predefined time dimension ranges. Typically, data access in the primary warehouse 1102 may be most frequent with new or freshly added data. As data ages in the primary warehouse 1102, it typically becomes accessed less and less. In accordance with some implementations, once data access falls below some pre-determined threshold, for example if a base table is accessed less than once a month, the data may be selected for archiving, (e.g., to be transferred to the secondary warehouse 1112). The conditions and thresholds for archiving are variable and may be set to optimize the performance of the overall system 1100.

The Query Log Analyzer 1120 also analyzes the usage of data in the secondary warehouse 1112 using information collected by its respective listener and/or query log. If data in the secondary warehouse 1112 is being accessed more frequently, it can be exported back from the secondary warehouse 1112 back to the primary warehouse 1102 to satisfy the relevant performance criteria of the system 1100. The Job Management Service 1105 may use decoding operations similar to those described above when exporting data from the secondary warehouse 1112 to the primary warehouse 1102. Data packs 221 from the secondary warehouse 1112 are decoded to the underlying base tables to be exported back to the primary warehouse 1102.

The Query usage statistics 1108 may also be used to optimize the KNs 224 in the database of the secondary warehouse 1112 so as to find the optimal KNs 224 based on query patterns, using an approach similar to the Knowledge Grid Optimizer 240 described above. The Query Explorer Module 1109 may also be used to analyze queries to understand how users are relating data thereby enabling further analysis of the data. Using this query information, reports or other information about data usage may be used to better organize or use the data. In addition to analyzing query data usage with respect to time dimensions, query data usage may also be estimated with respect to other dimensions. For example, it may be possible to detect that user group x runs queries over a much wider time ranges than user group y, or that column A is the only column accessed in table T by user group z. Similarly, the Query Explorer 1109 may also indicate how column data is referenced in queries, enabling better tuning of the primary warehouse 1102. For instance if tables are frequently joined, perhaps the tables should be combined. If a column is frequently used for filtering, an index may improve query speed.

The tiered architecture of the system 1100 seeks to address the problem that many data warehouses operate at or near capacity, and that the amount and detail of data being stored is ever increasing. While adding storage capability may accommodate increasing amounts of data, it may be costly and may not improve system performance or responsiveness. In addition, many database management systems have limits on how much data can be handled and managed to ensure performance levels are reasonable. The tiered architecture of the system 1100 allows less frequently used data, typically older data, to be removed from the primary warehouse 1102 to a secondary warehouse 1112 where the data can be compressed to reduce storage requirements. The system 1100 also allows for the restoration of data from the secondary warehouse 1112 to the primary warehouse 1102, if desired. However, in many cases, users simply do not have the disk space to accommodate large data set restores, presenting another advantage of the tiered warehouse approach.

In accordance with the tiered architecture of the system 1100, the primary warehouse 1102 may be implemented using an RDBMS 200 suitable for handling larger volumes of users efficiently, and configured to support a large number of reports that are executed regularly (e.g., daily, weekly, monthly, or annually). In this way, the primary warehouse 1102 may be used to reference more current data, for example such as the last two years. The secondary warehouse 1112 may be used to reference older data, which typically supports more analytical functions such as where long term histories are required to determine trends or statistical analyses. In this way, the types of queries performed on the primary warehouse 1102 and secondary warehouse 1112 may differ in terms of database tuning.

However, the tiered architecture allows short-term functions (e.g., reporting) to be implemented on the primary warehouse 1102 while analytical functions may be implemented on the secondary warehouse 1112. This may simplify data access and may allow improved tuning of the entire system 1100, which may improve overall performance and lowering costs by implementing a portion of the system 1100 on a lower cost, secondary warehouse 1112 of compressed data. In addition, using KNs 224 representations in the secondary warehouse 1112 where analytical type queries are more common may provide synergies in that the answer to analytical queries may be found directly in the DPNs 222 and KNs 224 themselves, negating the need to access the underlying data. Many statistical results are pre-calculated and stored with the DPNs 222 and/or KNs 224.

Figure 12:
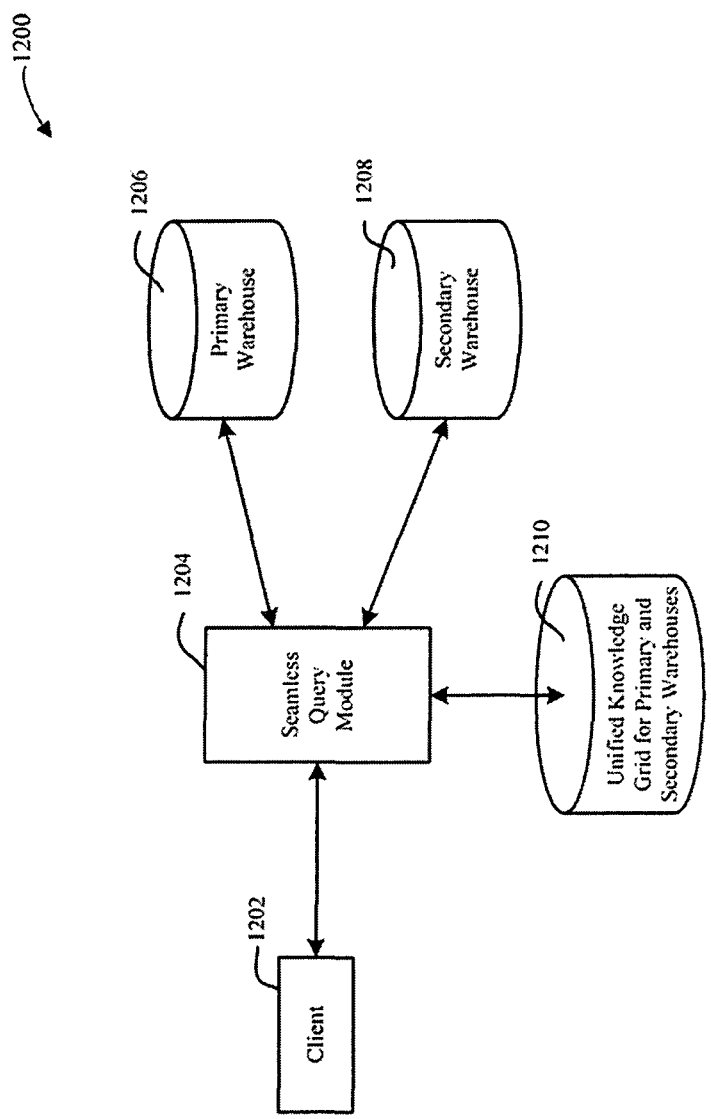
FIG. 12 is a schematic representation of a tiered data warehouse system.

FIG. 12 illustrates a tiered data warehouse system 1200. The system 1200 is similar to the system 1100 in that it may include a primary warehouse 1206 for "current data" or more frequently accessed data, and a secondary warehouse 1208 for "older data" or less frequently accessed data which may be compressed in data packs 221 and which contains DPNs 222 and KNs 224. However, the system 1200 also incorporates a Seamless Query Module 1204 and Unified Knowledge Grid 1210 for the primary warehouse 1206 and the secondary warehouse 1208. The Seamless Query Module 1204 includes information about the data of the primary warehouse 1206 and the secondary warehouse 1208 to provide a seamless query interface to a user via a client application 1202. A user using the client application 1202 may be provided with a SQL query interface to perform queries without regard to whether the data referenced by the query is stored in the primary warehouse 1206 and/or secondary warehouse 1208. The underlying tiered architecture of the system 1200 may be invisible to the user. Depending on the query parameters, the Seamless Query Module 1204 may determine whether the referenced data is in the primary warehouse 1206, secondary warehouse 1208, or in rare cases both. The Seamless Query Module 1204 then engages the respective database engine of the primary warehouse 1206 and/or second warehouse 1208, as necessary.

Although the methods and systems of the present disclosure are described in the context of data packs 221 and DPNs 222, the concept of a knowledge grid using statistical data elements may be created also for other database systems based on a conventional database having base tables and conventional database indices without the need of storing data packs 221 and DPNs 222.

Figure 13:
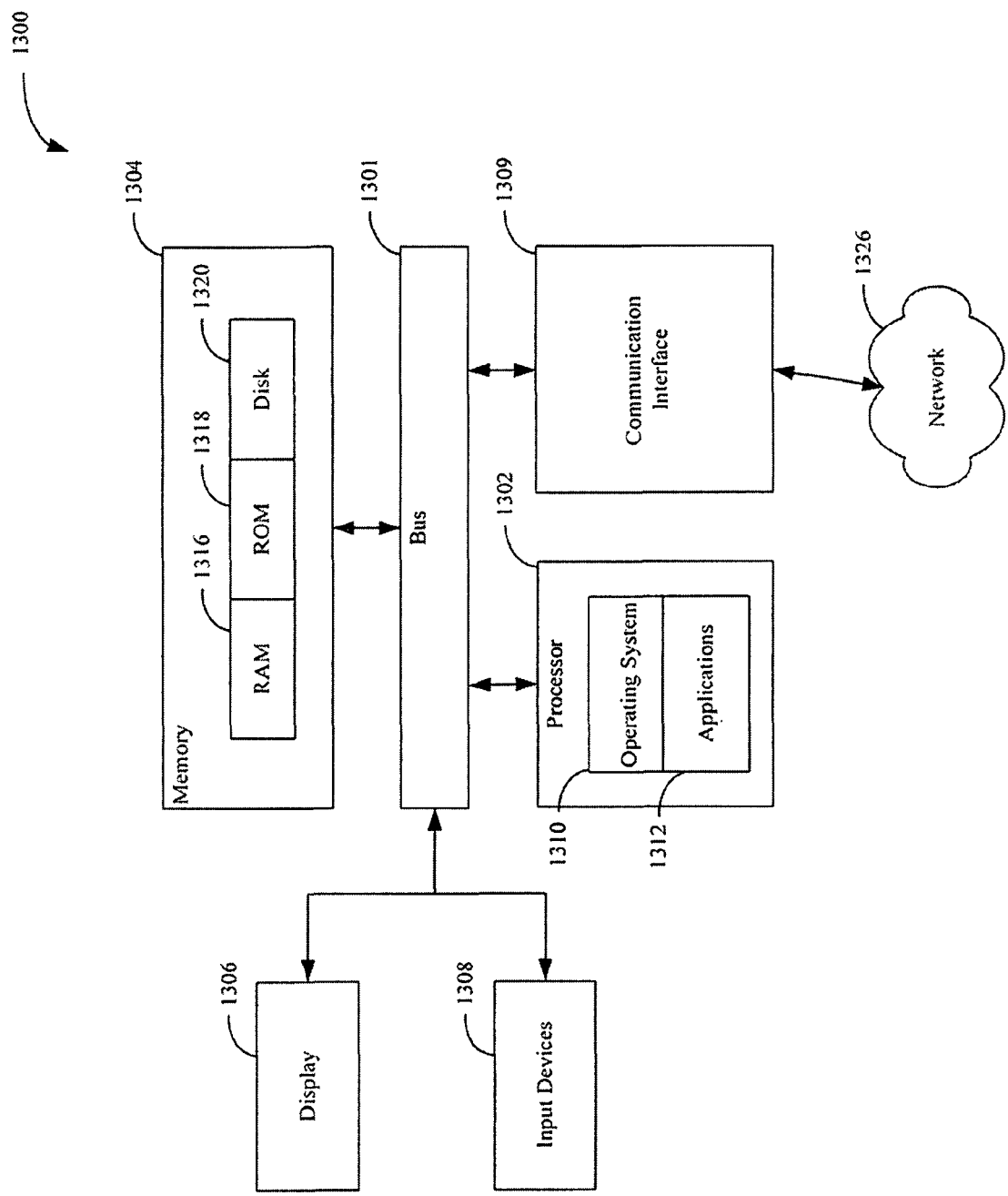
FIG. 13 is a schematic diagram illustrating a computing device that may be used to implement the methods disclosed.

FIG. 13 illustrates a computing device architecture 1300 that may be used with the systems described. The computing device architecture 1300 may be representative of the client application 202, or any of the computing devices, servers, or computers described above. The computing device 1300 generally may include a bus 1301, a microprocessor or processor 1302, a memory 1304, a display 1306, one or more user input devices 1308, and a communication interface 1309, which may all be coupled to the bus 1301. The computing device 1300 may additionally include a display device (not shown) for communicating an output to a user. In one example, the user input devices 1308 may be a keyboard or pointing device such as a mouse. The communication interface 1309 provides an interface for communicating with a network 1326. An operating system 1310 or applications 1312 run on the processor 1302. The memory 1304 includes Random Access Memory (RAM) 1316, Read Only Memory (ROM) 1318, and a disk 1320. In one example, the data processing system 1300 may include either a client or a server. Any of the software modules or components mentioned above may be stored in the memory 1304 for execution by the processor 1302.

In accordance with some aspects, there is provided a method for encoding column data from a base table in one or more data packs, the base table including one or more columns of data, the method including: selecting a column in the base table; selecting a compression algorithm based on a data type in the column; compressing data from the column using the selected compression algorithm; and storing the compressed column data in a data pack.

In some aspects, each of the two or more columns of data may be at least one of: a string, a numeric value, floating point value, and binary.

In some aspects, the method may further include, before compressing the column data: generating a null mask representing the positions of null and non-null value positions in the column; generating a reduced data set from the column data, including removing the null position from the column data; and wherein the data from the column compressed in the compression step is the reduced data set, and wherein the null mask is stored in the data pack the compressed column data.

These and other aspects and features of the present disclosure will become apparent to persons of ordinary skill in the art upon review of the above detailed description, taken in combination with the appended drawings.

While the present disclosure is primarily described as a method, a person of ordinary skill in the art will understand that the present disclosure is also directed to an apparatus or system for carrying out the disclosed method and including apparatus parts for performing each described method step, be it by way of hardware components, a computer programmed by appropriate software to enable the practice of the disclosed method, by any combination of the two, or in any other manner. Moreover, an article of manufacture for use with the apparatus, such as a pre-recorded storage device or other similar computer readable medium including program instructions recorded thereon, or a computer data signal carrying computer readable program instructions, may direct an apparatus to facilitate the practice of the disclosed method. It is understood that such apparatus, articles of manufacture, and computer data signals also come within the scope of the present disclosure.

The embodiments of the present disclosure described above are intended to be examples only, for the purposes of illustration and not intended to be limiting. Those of skill in the art may effect alterations, modifications and variations to the particular embodiments without departing from the scope of the present disclosure. In particular, selected features from one or more of the above-described embodiments may be combined to create alternative embodiments not explicitly described, features suitable for such combinations being readily apparent to persons skilled in the art. The subject matter described herein in the recited claims intends to cover and embrace all suitable changes in technology.

What is claimed is:

1. A method for applying lossless data compression in a relational database system, the method using a filter cascade having at least one compression filter stage in the filter cascade, the method comprising:

providing data input to a compression filter stage of the filter cascade;

dynamically evaluating a plurality of data filters available for use in the compression filter stage to be applied to the data input to determine at least one of whether to apply at least one data filter of the plurality of data filters and whether to reuse the at least one data filter;

determining a proposed data filter to be applied to the data input, from the plurality of data filters that were dynamically evaluated, that provides an acceptable compression result based on dynamically evaluating the proposed data filter;

applying the proposed data filter from the plurality of data filters to the data input to produce reconstruction information and filtered data;

compressing the reconstruction information to be included in a filter stream; and providing the filtered data as a compression filter stage output of the compression filter stage.

2. The method according to claim 1, further comprising:

determining if one or more additional data filters are expected according to a dynamic evaluation to further improve compression of the compression filter stage output;

providing the compression filter stage output as the data input to a subsequent compression filter stage if one or more additional data filters are expected according to a dynamic evaluation to further improve compression of the compression filter stage output; and repeating the method of claim 1 for the subsequent compression filter stage.

3. The method according to claim 2, further comprising:

repeating the method of claim 2 a total of n times, where n is an integer representing the number of stages of compression filter stages in the filter cascade where data filters can be applied to further improve compression of the compression filter stage output of the prior stage.

4. The method according to claim 1, wherein the relational database is a column-oriented relational database.

5. The method according to claim 4, wherein data cells for columns of data in the column-oriented relational database are formed separately and, for each of the columns of data, the data cells are of a specified number of records grouped together as a data unit, wherein values related to a single attribute and a predetermined number of rows are stored in the data units, the data units being provided as the data input to the compression filter stage of the filter cascade.

6. The method according to claim 5, wherein the specified number is selected from the group consisting of: 64 kilobytes of records and 65,536 records.

7. The method according to claim 1, wherein each of the plurality of data filters includes a compression algorithm for compressing the reconstruction information, and the types of compression algorithms and data filters applied in the compression algorithms are dynamically adjusted for the data input.

8. The method according to claim 1, wherein the compressing is based on a compression algorithm selected from the group consisting of: arithmetic encoding, range coding, Shannon-Fano-Elias coding, Shannon coding, Huffman coding, Rice coding, Golomb coding, Tunstall coding, and prediction by partial matching.

9. The method according to claim 3, wherein once all of the compression filter stages of the filter cascade are applied, the data input that was supplied to a first compression filter stage of the filter cascade is all represented in the filter stream with a final compression filter stage of the filter cascade having no output, the filter stream comprising compressed reconstruction information from each compression filter stage of the filter cascade.

10. The method according to claim 9, wherein the data input is recoverable by decompressing the filter stream and applying corresponding decompression filter stages in reverse order to the compression filter stages.

11. The method according to claim 3, wherein the compression filter stages are applied in any order.

12. The method according to claim 1, wherein the data input is a data unit having a plurality of data elements and at least one specific data filter is applied more than once to the data unit.

13. The method according to claim 1, wherein the data input is a data unit having a plurality of data elements and at least one compression filter stage of the filter cascade has a data filter that removes null elements from the data unit and creates a null map indicating the positions of the null elements.

14. The method according to claim 13, wherein the null map comprises a bit map series of zeros and ones, each bit representing each data element, a zero bit indicating the presence of a non-null element and a one bit indicating the presence of a null element, the resulting bit map series being included in the reconstruction information.

15. The method according to claim 13, wherein the null elements are removed from the data input, and the data input with the null elements removed is provided in the filtered data.

16. The method according to claim 1, wherein the data input includes a data unit having a plurality of data elements of numeric data, the numeric data having an element with a minimum value, and at least one compression filter stage has a data filter that subtracts the minimum value from all of the data elements of the data unit, the data elements with the minimum value subtracted being provided as the filtered data, the minimum value being included in the reconstruction information.

17. The method according to claim 1, wherein the data input includes a data unit having a plurality of data elements of numeric data, the numeric data having a greatest common divisor (GCD) and at least one compression filter stage has a data filter that reduces each data element of the data unit by dividing each data element by the GCD and providing the reduced data unit as the filtered data, the GCD value being included in the reconstruction information.

18. The method according to claim 1, wherein the data input includes a data unit having a plurality of data elements, and at least one compression filter stage has a data filter that builds a partial dictionary of elements that have an occurrence frequency in the data unit greater than a predetermined frequency, the elements of the data unit that are included in the dictionary being removed from the data unit and being included in the reconstruction information, data elements of the data unit that are not included in the dictionary being included in the filtered data.

19. The method according to claim 1, wherein the data input includes a data unit having a plurality of data elements, and at least one compression filter stage has a data filter that builds a partial dictionary of elements comprising selected bits of all of the data elements, the selected bits being removed from the data unit and included in the reconstruction information, the remaining bits of the data elements being included in the filtered data.

20. The method according to claim 19, wherein the selected bits comprise top bits of the data elements.

21. The method according to claim 19, wherein the selected bits comprise bottom bits of the data elements.

22. The method according to claim 1, wherein the data input includes a data unit having a plurality of data elements of numeric data, the data elements having an element with a maximum value, and at least one compression filter stage has a data filter that calculates, for each element, a difference between one element and the next element and the differences are represented in modulo of the maximum value +1, the maximum value being included in the reconstruction information, and a first data element and the differences being included in the filtered data.

23. The method according to claim 1, wherein the data input includes a data unit having a plurality of data elements, at least one data element having an outlying value, and at least one compression filter stage has a data filter that removes the outlying value from the data input, the outlying value and an indicator of the position of the outlying value being included in the reconstruction information, the data input with the outlying value removed being included in the filtered data.

24. The method according to claim 1, wherein the data input includes a data unit having a plurality of elements and at least one compression filter stage has a data filter that includes all the elements in the reconstruction information, and the compression filter stage output is empty.

25. The method according to claim 1, wherein the data input includes a data unit having a plurality of alphanumeric elements, each element comprising at least one alphanumeric character, and at least one compression filter stage has a data filter that:
  processes the element character by character as long sequences and produces a suffix tree of all possible word suffixes;
  calculates a probability of occurrence of each character; and
  provides the suffix tree information as a dictionary of values and associated probabilities as each character is processed, the dictionary being included in the reconstruction information;
  wherein the probabilities in the dictionary are updated as each subsequent character is processed.

26. The method according to claim 3, wherein each data filter that is used in a compression filter stage has an associated predetermined compression algorithm for compressing the reconstruction information.

27. A method for performing lossless data compression using a filter cascade on data in a relational database, the method comprising:
  providing data input having a plurality of data elements;
  dynamically evaluating a plurality of data filters available for use in a first compression filter stage to be applied to the data input to determine at least one of whether to apply at least one data filter of the plurality of data filters and whether to reuse the at least one data filter;
  determining a first data filter to be applied to the data input, from the plurality of data filters that were dynamically evaluated, that provides an acceptable compression result based on dynamically evaluating the first data filter;
  applying the first data filter to the data input of the first compression filter stage to produce reconstruction information and filtered data;
  compressing the reconstruction information and including the compressed reconstruction information in a filter stream;
  providing the filtered data as a compression filter output; and
  repeating the applying and compressing using the compression filter output as an input for at least one subsequent compression filter stage.

28. The method of claim 27, wherein the relational database is a column-oriented relational database.

29. The method of claim 28, wherein data cells for columns of data in the column-oriented relational database are formed separately and, for each of the columns of data, the data cells are of a specified number of records grouped together as a data unit, the data units being provided as the data input.

30. The method of claim 29, wherein the specified number is selected from the group consisting of: 64 kilobytes of records and 65,536 records.

31. The method of claim 27, wherein the compressing comprises applying a compression algorithm, the compression algorithm and parameters of the compression algorithm being dynamically adjustable based on the data input.

32. The method of claim 31, wherein the compression algorithm is selected from the group consisting of: arithmetic coding, range coding, Shannon-Fano-Elias coding, Shannon coding, Huffman coding, Rice coding, Golomb coding, Tunstall coding, and prediction by partial matching.

33. The method of claim 27, wherein the applying and compressing are repeated until the compression filter output of a final compression filter stage in the filter cascade is empty.

34. The method of claim 27, wherein the compression filter stages are applied in a pre-determined order.

35. The method of claim 27, wherein at least one specific data filter is applied more than once.

36. The method of claim 27, further comprising, before applying the data filter:
  evaluating whether the predicted compression of the data filter would provide improved compression compared to the data input; and
  where evaluation of the given data filter results in a determination that the given data filter will not provide improved compression, the given data filter is not applied, and the evaluating is repeated with at least one subsequent data filter.

37. The method of claim 36, wherein the evaluating step comprises an algorithm adapted for the given data filter.

38. The method of claim 27, wherein at least one compression filter stage has a data filter that filters the data input by removing null elements in the data input and creates a null mask indicating the location of the null elements, the null mask being included in the reconstruction information and the data having the null elements removed being included in the filtered data.

39. The method of claim 38, wherein the null map comprises a bit map series of zeros and ones, each bit representing each data element, a zero bit indicating the presence of a non-null element and a one bit indicating the presence of a null element, the resulting bit map series being included in the reconstruction information.

40. The method of claim 38, wherein the null elements are removed from the data input, and the data input with the null elements removed is provided in the filtered data.

41. The method of claim 27, wherein the data input has a data element with a minimum value, and at least one compression filter stage has a data filter that filters the data input by subtracting the minimum value from each element, the minimum value being included in the reconstruction information and the data input having the minimum value subtracted from each data element being included in the filtered data.

42. The method of claim 27, wherein the data input has a greatest common divisor (GCD) among a number of elements, and at least one compression filter stage has a data filter that filters the data input by dividing each data element by the GCD, the GCD being included in the reconstruction information and the data input with the number of elements having been divided by the GCD being included in the filtered data.

43. The method of claim 27, wherein the data input has a first group of elements each having a high frequency of occurrence and second group of elements each having a low frequency of occurrence, and at least one compression filter stage has a data filter that filters the data input by associating a symbol with each element in the first group, creating a dictionary associating each symbol with each respective element of the first group and respective frequencies of occurrence, the dictionary and the first group of elements being included in the reconstruction information and the elements of the second group being included in the filtered data.

44. The method of claim 27, wherein the data input has a plurality of elements, each comprising a plurality of bits, and at least one compression filter has a data filter that creates a dictionary associating selected bits of each element with a symbol, the dictionary and the selected bits being included in the reconstruction information and the elements with the selected bits removed being included in the filtered data.

45. The method of claim 44, wherein the selected bits comprise top bits of each element.

46. The method of claim 44, wherein the selected bits comprise bottom bits of each element.

47. The method of claim 27, wherein the data input has a plurality of numeric elements, the elements having a maximum value, and at least one compression filter has a data filter that, for each element, calculates differences between one element and a subsequent element, the differences being represented in modulo of the maximum value +1, the differences forming a difference sequence, and the maximum value being included in the reconstruction information and a first element and the difference sequence being included in the filtered data.

48. A method of lossless data decompression for compressed data in a relational database, the method comprising:
providing a filter stream comprising compressed data that was compressed using a filter cascade comprising at least one compression filter stage, wherein the compression was accomplished by dynamically evaluating a plurality of data filters available for use in the compression filter stage to be applied to the data input to determine at least one of whether to apply at least one data filter of the plurality of data filters and whether to reuse the at least one data filter, determining a proposed data filter to be applied to the data input, from the plurality of data filters that were dynamically evaluated, that provides an acceptable compression result based on dynamically evaluating the proposed data filter, and applying the proposed data filter from the plurality of data filters to the data input to produce reconstruction information and filtered data;
retrieving from the compressed data the identity and order of the compression filter stages that were applied to the compressed data and the data filters that were used in each compression filter stage; and
applying corresponding decompression filters for each of the data filters used in the compression filter stages in a reverse order in which the data filters were applied in the compression filter stages during compression.

49. The method of claim 48, further comprising, before the applying, processing the compressed data through the data filters used in the compression filter stages in the order in which the data filters were applied in the compression filter stages during compression, thus identifying the corresponding decompression filters.

50. The method of claim 48, wherein the relational database is a column-oriented relational database.

51. A relational database system for applying lossless data compression, the system using a filter cascade having at least one compression filter stage in the filter cascade, the system comprising:
a database server having:
a microprocessor for controlling operation of the database server; and
a memory coupled to the microprocessor;
the database server including a compression module resident in the memory for execution by the microprocessor, the compression module configured to:
i.) receive data input to a compression filter stage of the filter cascade;
ii.) dynamically evaluate a plurality of data filters available for use in the compression filter stage to determine at least one of whether to apply at least one data filter of the plurality of data filters and whether to reuse the at least one data filter;
iii.) determine a proposed data filter to be applied to the data input, from the plurality of data filters that were dynamically evaluated, that provides an acceptable compression result based on dynamically evaluating the proposed data filter;
iv.) dynamically apply the proposed data filter from the plurality of data filters to the data input to produce reconstruction information and filtered data;
v.) compress the reconstruction information to be included in a filter stream; and
vi.) provide the filtered data as a compression filter stage output for the compression filter stage.

52. The system according to claim 51, wherein the compression module is further configured to:
vii.) determine if one or more additional data filters can be applied to further improve compression of the compression filter stage output;
viii.) provide the compression filter stage output as the data input to a subsequent compression filter stage if one or more additional data filters can be applied to further improve compression of the compression filter stage output; and
ix.) repeat i.) to vi.) for the subsequent compression filter stage.

53. The system according to claim 52, wherein the compression module is further configured to:
x.) repeat i.) through ix.) for each compression filter stage in the filter cascade where data filters can be applied to further improve compression of the compression filter stage output of the prior stage.

54. The system according to claim 51, wherein the relational database is a column-oriented relational database.

55. The system according to claim 54, wherein data cells for columns of data in the column-oriented relational database are formed separately and, for each of the columns of data, the data cells are of a specified number of records grouped together as a data unit, the data units being provided as the data input to the compression filter stage of the filter cascade.

56. The system according to claim 55, wherein the specified number is selected from the group consisting of: 64 kilobytes of records and 65,536 records.

57. The system according to claim 51, wherein each of the plurality of data filters includes a compression algorithm for compressing the reconstruction information, and the types of compression algorithms and data filters applied in the compression algorithms are dynamically adjusted for the data input.

58. The system according to claim 57, wherein the compression algorithm is selected from the group consisting of: arithmetic encoding, range coding, Shannon-Fano-Elias coding, Shannon coding, Huffman coding, Rice coding, Golomb coding, Tunstall coding, and prediction by partial matching.

59. The system according to claim 53, wherein once all of the compression filter stages of the filter cascade are applied, the data input that was supplied to a first compression filter stage of the filter cascade is all represented in the filter stream with a final compression filter stage of the filter cascade having no output, the filter stream comprising compressed reconstruction information from each compression filter stage of the filter cascade.

60. The system according to claim 59, wherein the data input is recoverable by decompressing the filter stream and applying corresponding decompression filter stages in reverse order to the compression filter stages.

61. The system according to claim 51, wherein the compression filter stages are applied in any order.

62. The system according to claim 51, wherein at least one specific data filter is applied more than once.

63. The system according to claim 53, wherein the data input is a data unit having a plurality of data elements and at least one compression filter stage of the filter cascade has a data filter that removes null elements from the data unit and creates a null map indicating the positions of the null elements.

64. The system according to claim 63, wherein the null map comprises a bit map series of zeros and ones, each bit representing each data element, a zero bit indicating the presence of a non-null element and a one bit indicating the presence of a null element, the resulting bit map series being included in the reconstruction information.

65. The system according to claim 63, wherein the null elements are removed from the data input, and the data input with the null elements removed is provided in the filtered data.

66. The system according to claim 53, wherein the data input includes a data unit having a plurality of data elements of numeric data, the numeric data having an element with a minimum value and at least one compression filter stage has a data filter that subtracts the minimum value from all of the data elements of the data unit, the data elements with the minimum value subtracted being provided as the filtered data, the minimum value being included in the reconstruction information.

67. The system according to claim 53, wherein the data input includes a data unit having a plurality of data elements of numeric data, the numeric data having a greatest common divisor (GCD) and at least one compression filter stage has a data filter that reduces each data element of the data unit by dividing each data element by the GCD and providing the reduced data unit as the filtered data, the GCD value being included in the reconstruction information.

68. The system according to claim 53, wherein the data input includes a data unit having a plurality of data elements, and at least one compression filter stage has a data filter that builds a partial dictionary of elements that have an occurrence frequency in the data unit greater than a predetermined frequency, the elements of the data unit that are included in the dictionary being removed from the data unit and being included in the reconstruction information, data elements of the data unit that are not included in the dictionary being included in the filtered data.

69. The system according to claim 53, wherein the data input includes a data unit having a plurality of data elements, and at least one compression filter stage has a data filter that builds a partial dictionary of elements comprising selected bits of all of the data elements, the selected bits being removed from the data unit and included in the reconstruction information, the remaining bits of the data elements being included in the filtered data.

70. The system according to claim 69, wherein the selected bits comprise top bits of the data elements.

71. The system according to claim 69, wherein the selected bits comprise bottom bits of the data elements.

72. The system according to claim 53, wherein the data input includes a data unit having a plurality of data elements of numeric data, the data elements having an element with a maximum value, and at least one compression filter stage has a data filter that calculates, for each element; a difference between one element and the next element and the differences are represented in modulo of the maximum value +1, the maximum value being included in the reconstruction information, and a first data element and the differences being included in the filtered data.

73. The system according to claim 53, wherein the data input includes a data unit having a plurality of data elements, at least one data element having an outlying value, and at least one compression filter stage has a data filter that removes the outlying value from the data input, the outlying value and an indicator of the position of the outlying value being included in the reconstruction information, the data input with the outlying value removed being included in the filtered data.

74. The system according to claim 53, wherein the data input includes a data unit having a plurality of elements and at least one compression filter stage has a data filter that includes all the elements in the reconstruction information, and the compression filter stage output is empty.

75. The system according to claim 53, wherein the data input includes a data unit having a plurality of alphanumeric elements, each element comprising at least one alphanumeric character, and at least one compression filter stage has a data filter designed to:
  process the element character by character as long sequences aid produces a suffix tree of all possible word suffixes;
  calculate a probability of occurrence of each character; and
  provide the suffix tree information as a dictionary of values and associated probabilities as each character is processed, the dictionary being included in the reconstruction information;
  wherein the probabilities in the dictionary are updated as each subsequent character is processed.

76. The system according to claim 53, wherein each data filter that is used in a compression filter stage has an associated predetermined compression algorithm for compressing the reconstruction information.

77. A relational database system for performing lossless data compression using a filter cascade on database data, the system comprising:
  a database server comprising:
  a microprocessor for controlling operation of the database server; and
  a memory coupled to the microprocessor;

the database server including a compression module resident in the memory for execution by the microprocessor, the compression module configured to:
i.) receive data input having a plurality of data elements;
ii.) dynamically evaluate a plurality of data filters available for use in a first compression filter stage to determine at least one of whether to apply at least one data filter of the plurality of data filters and whether to reuse the at least one data filter;
iii.) determine a first data filter to be applied to the data input, from the plurality of data filters that were dynamically evaluated, that provides an acceptable compression result based on dynamically evaluating the first data filter;
iv.) dynamically apply the first data filter to the data input of the first compression filter stage to produce reconstruction information and filtered data;
v.) compress the reconstruction information and include the compressed reconstruction information in a filter stream;
vi.) provide the filtered data as a compression filter output; and
vii.) repeat ii.) through vi.) using the compression filter output as an input for at least one subsequent compression filter stage.

78. The system of claim 77, wherein the relational database is a column-oriented relational database.

79. The system of claim 78, wherein data cells for columns of data in the column-oriented relational database are formed separately and, for each of the columns of data, the data cells are of a specified number of records grouped together as a data unit, the data units being provided as the data input.

80. The system of claim 79, wherein the specified number is selected from the group consisting of: 64 kilobytes of records and 65,536 records.

81. The system of claim 77, wherein iv.) comprises the application of a compression algorithm, the compression algorithm and parameters of the compression algorithm being dynamically adjustable based on the data input.

82. The system of claim 81, wherein the compression algorithm is selected from the group consisting of: arithmetic coding, range coding, Shannon-Fano-Elias coding, Shannon coding, Huffman coding, Rice coding, Golomb coding, Tunstall coding, and prediction by partial matching.

83. The system of claim 77, wherein the compression module is further configured to repeat ii.) through iv.) until the compression filter output of a final compression filter stage in the filter cascade is empty.

84. The system of claim 77, wherein the compression filter stages are applied in a pre-determined order.

85. The system of claim 77, wherein at least one compression filter stage is applied more than once.

86. The system of claim 77, wherein the compression module is further configured to:
evaluate whether the predicted compression of the data filter would provide improved compression compared to the data input; and
wherein evaluation of the given data filter results in a determination that the given data filter will not provide improved compression, the given data filter is not applied, and the evaluation is repeated with at least one subsequent data filter;
before applying a data filter.

87. The system of claim 86, wherein the evaluation comprises application of an algorithm adapted for the given data filter.

88. The system of claim 77, wherein at least one compression filter stage has a data filter that filters the data input by removing null elements in the data input and creates a null mask indicating the location of the null elements, the null mask being included in the reconstruction information and the data having the null elements removed being included in the filtered data.

89. The system of claim 88, wherein the null map comprises a bit map series of zeros and ones, each bit representing each data element, a zero bit indicating the presence of a non-null element and a one bit indicating the presence of a null element, the resulting bit map series being included in the reconstruction information.

90. The system of claim 88, wherein the null elements are removed from the data input, and the data input with the null elements removed is provided in the filtered data.

91. The system of claim 77, wherein the data input has a data element with a minimum value, and at least one compression filter stage has a data filter that filters the data input by subtracting the minimum value from each element, the minimum value being included in the reconstruction information and the data input having the minimum value subtracted from each data element being included in the filtered data.

92. The system of claim 77, wherein the data input has a greatest common divisor (GCD) among a number of elements, and at least one compression filter stage has a data filter that filters the data input by dividing each data element by the GCD, the GCD being included in the reconstruction information and the data input with the number of elements having been divided by the GCD being included in the filtered data.

93. The system of claim 77, wherein the data input has a first group of elements each having a high frequency of occurrence and second group of elements each having a low frequency of occurrence, and at least one compression filter stage has a data filter that filters the data input by associating a symbol with each element in the first group, creating a dictionary associating each symbol with each respective element of the first group and respective frequencies of occurrence, the dictionary and the first group of elements being included in the reconstruction information and the elements of the second group being included in the filtered data.

94. The system of claim 77, wherein the data input has a plurality of elements, each comprising a plurality of bits, and at least one compression filter has a data filter that creates a dictionary associating selected bits of each element with a symbol, the dictionary and the selected bits being included in the reconstruction information and the elements with the selected bits removed being included in the filtered data.

95. The system of claim 94, wherein the selected bits comprise top bits of each element.

96. The system of claim 94, wherein the selected bits comprise bottom bits of each element.

97. The system of claim 77, wherein the data input has a plurality of numeric elements, the elements having a maximum value, and at least one compression filter has a data filter that, for each element, calculates differences between one element and a subsequent element, the differences being represented in modulo of the maximum value +1, the differences forming a difference sequence, and the maximum value being included in the reconstruction information and a first element and the difference sequence being included in the filtered data.

98. A relational database system for decompression of compressed data, the system comprising:

a database server comprising:
a microprocessor for controlling operation of the database server; and
a memory coupled to the microprocessor;
the database server including a decompression module resident in the memory for execution by the microprocessor, the decompression module configured to:
i.) receive a filter stream comprising compressed data that was compressed using a filter cascade comprising at least one compression filter stage, wherein the compression was accomplished by dynamically evaluating a plurality of data filters available for use in the at least one compression filter stage to be applied to the data input to determine at least one of whether to apply at least one data filter of the plurality of data filters and whether to reuse the at least one data filter, determining a proposed data filter to be applied to the data input, from the plurality of data filters that were dynamically evaluated, that provides an acceptable compression result based on dynamically evaluating the proposed data filter, and applying the proposed data filter from the plurality of data filters to the data input to produce reconstruction information and filtered data;
ii.) retrieve from the compressed data the identity and order of the compression filter stages that were applied to the compressed data, and the data filters that were used in each compression filter stage; and
iii.) apply corresponding decompression filters for each of the data filters used in the compression filter stages in a reverse order in which the data filters were applied in the compression filter stages during compression.

99. The system of claim 98, wherein the decompression module is further configured to:
process the compressed data through the data filters used in the compression filter stages in the order in which the data filters were applied in the compression filter stages during compression, in order to identify the corresponding decompression filters before applying the decompression filters.

100. The system of claim 98, wherein the relational database is a column-oriented relational database.

101. A computer program product used with a processor, the computer program product comprising:
a non-transitory computer readable medium tangibly embodying computer readable program code used when implementing a method for applying lossless data compression in a relational database system, the adaptive data compression using a filter cascade having at least one compression filter stage in the filter cascade, the computer readable medium including:
computer readable program code that provides for data input to a compression filter stage of the filter cascade;
computer readable program code that provides for dynamically evaluating a plurality of data filters available for use in the compression filter stage to be applied to the data input to determine at least one of whether to apply at least one data filter of the plurality of data filters and whether to reuse the at least one data filter;
computer readable program code that provides for determining a proposed data filter to be applied to the data input, from the plurality of data filters that were dynamically evaluated, that provides an acceptable compression result based on dynamically evaluating the proposed data filters;
computer readable program code that provides for applying the proposed data filter from the plurality of data filters to the data input to produce reconstruction information and filtered data;
computer readable program code that provides for compressing the reconstruction information to be included in a filter stream; and
computer readable program code that provides for the filtered data to be used as a compression filter stage output for the compression filter stage.

102. The computer program product according to claim 101, further comprising:
computer readable program code that provides for determining if one or more additional data filters can be applied to further improve compression of the compression filter stage output;
computer readable program code that provides for the compression filter stage output to be used as the data input to a subsequent compression filter stage if one or more additional data filters can be applied to further improve compression of the compression filter stage output; and
computer readable program code that provides for repeating the use of the computer readable program code of claim 101 for the subsequent compression filter stage.

103. The computer program product according to claim 102, further comprising:
computer readable program code that provides for repeating the use of the computer readable program code of claim 102 a total of n times, where n is an integer representing the number of stages of compression filter stages in the filter cascade where data filters can be applied to further improve compression of the compression filter stage output of the prior stage.

104. The method of claim 2, further comprising reapplying the data filter that provides the better improved compression result.

105. The method of claim 27, further comprising reapplying the data filter that provides the better improved compression result.

106. The method of claim 52, further comprising reapplying the data filter that provides the better improved compression result.

107. The method of claim 77, further comprising reapplying the data filter that provides the better improved compression result.

108. The method of claim 102, further comprising reapplying the data filter that provides the better improved compression result.

109. The method of claim 1, wherein the input data is filtered based on at least one of a relationship and redundancy within the input data.

* * * * *